(12) United States Patent
Willer et al.

(10) Patent No.: US 7,778,073 B2
(45) Date of Patent: Aug. 17, 2010

(54) INTEGRATED CIRCUIT HAVING NAND MEMORY CELL STRINGS

(75) Inventors: Josef Willer, Riemerling (DE); Franz Hofmann, Munich (DE); Detlev Richter, Munich (DE); Nicolas Nagel, Dresden (DE)

(73) Assignee: Qimonda AG, Munich (DE)

( * ) Notice: Subject to any disclaimer, the term of this patent is extended or adjusted under 35 U.S.C. 154(b) by 252 days.

(21) Appl. No.: 11/872,655

(22) Filed: Oct. 15, 2007

(65) Prior Publication Data

US 2009/0097317 A1    Apr. 16, 2009

(51) Int. Cl.
*G11C 16/04* (2006.01)

(52) U.S. Cl. .................. 365/185.03; 365/185.16; 365/185.17; 365/185.28; 257/E21.179; 257/E21.422; 257/314; 257/315

(58) Field of Classification Search ............ 365/185.03, 365/185.16, 185.17, 185.28; 257/E21.179, 257/E21.422, 314, 315
See application file for complete search history.

(56) References Cited

U.S. PATENT DOCUMENTS

| | | | |
|---|---|---|---|
| 6,548,861 B2 | 4/2003 | Palm et al. | |
| 6,661,053 B2 | 12/2003 | Willer et al. | |
| 6,794,249 B2 | 9/2004 | Palm et al. | |
| 6,844,584 B2 | 1/2005 | Palm et al. | |
| 7,272,040 B2 * | 9/2007 | Mikolajick et al. | 365/185.03 |
| 2002/0024092 A1 | 2/2002 | Palm et al. | |
| 2006/0192266 A1 | 8/2006 | Willer et al. | |
| 2006/0245233 A1 | 11/2006 | Mikolajick et al. | |

FOREIGN PATENT DOCUMENTS

| | | |
|---|---|---|
| DE | 100 39 441 A1 | 2/2002 |
| DE | 10 2005 025 167 B3 | 7/2006 |
| EP | 1 307 920 | 5/2003 |

* cited by examiner

*Primary Examiner*—Tuan T Nguyen
*Assistant Examiner*—Toan Le

(57) ABSTRACT

Embodiments of the present invention relate generally to integrated circuits and methods for manufacturing an integrated circuit. In an embodiment of the invention, an integrated circuit having a memory cell is provided. The memory cell may include a trench in a carrier, a charge trapping layer structure in the trench, the charge trapping layer structure comprising at least two separate charge trapping regions, electrically conductive material at least partially filled in the trench, and source/drain regions next to the trench.

18 Claims, 21 Drawing Sheets

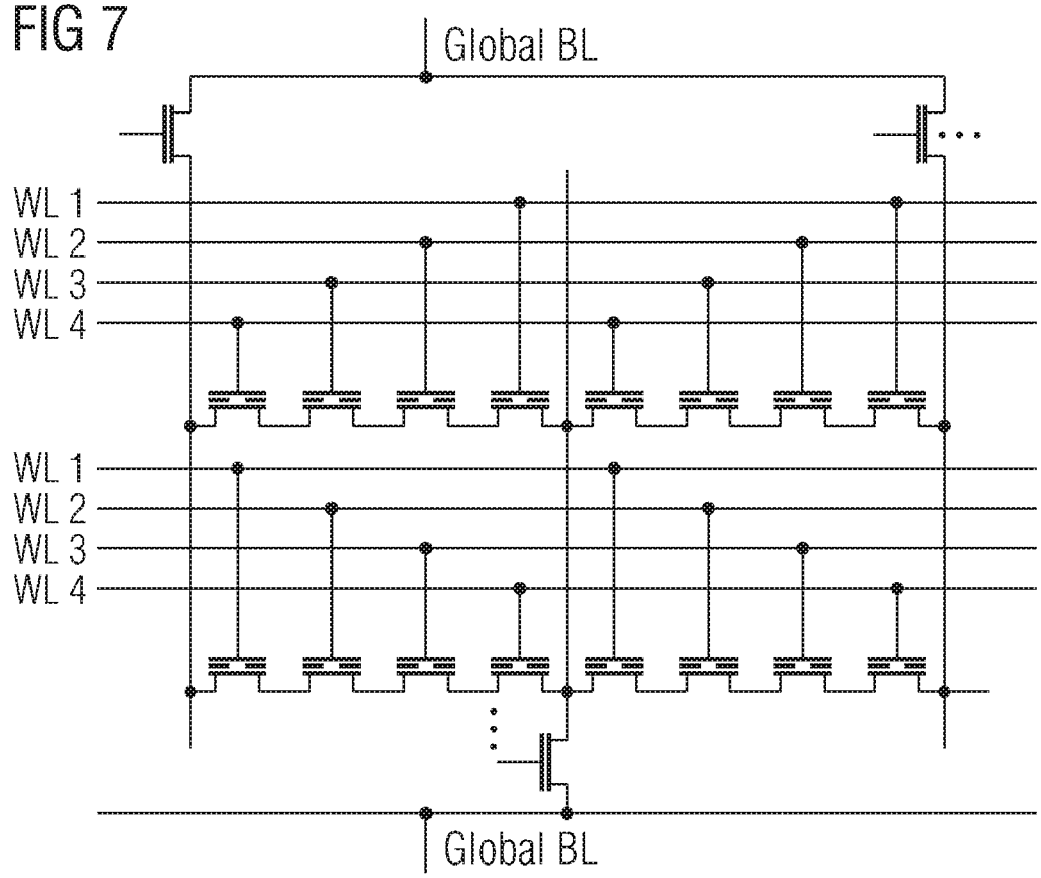
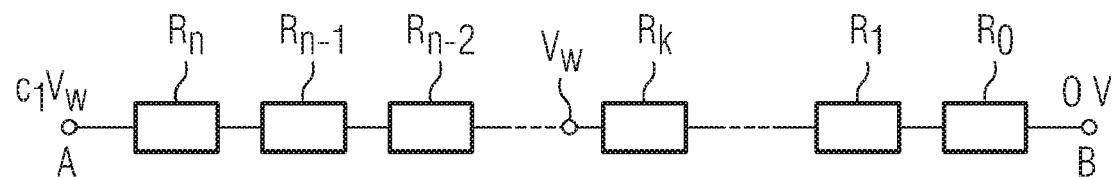
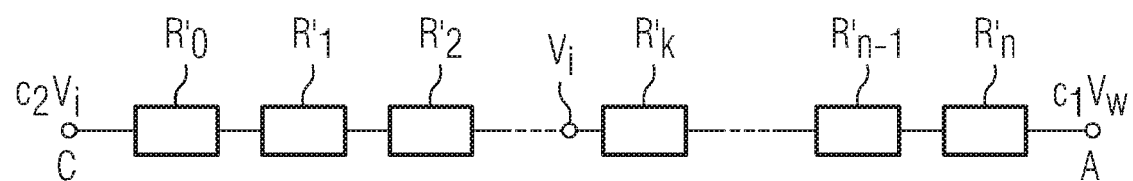

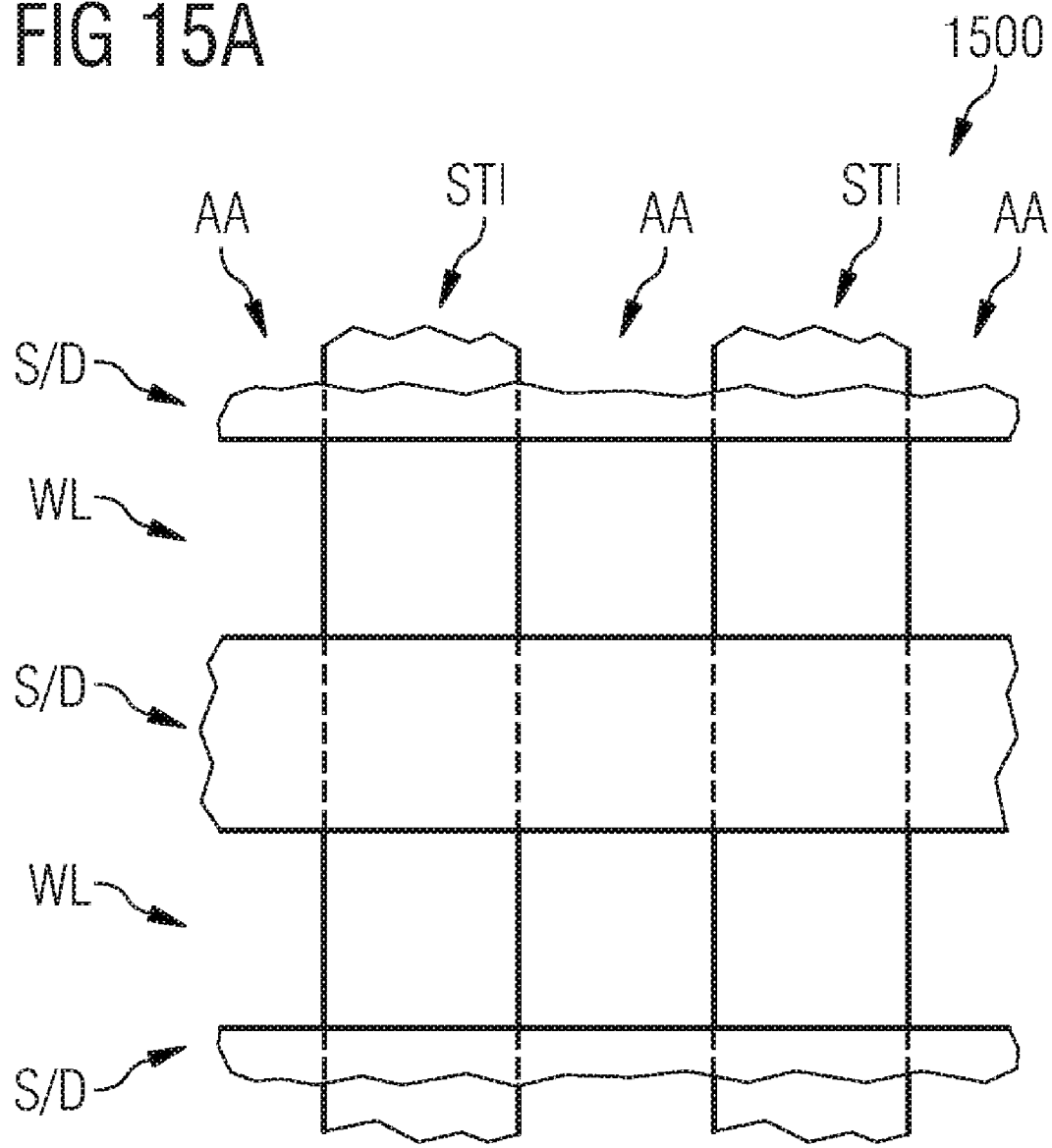

FIG 15B
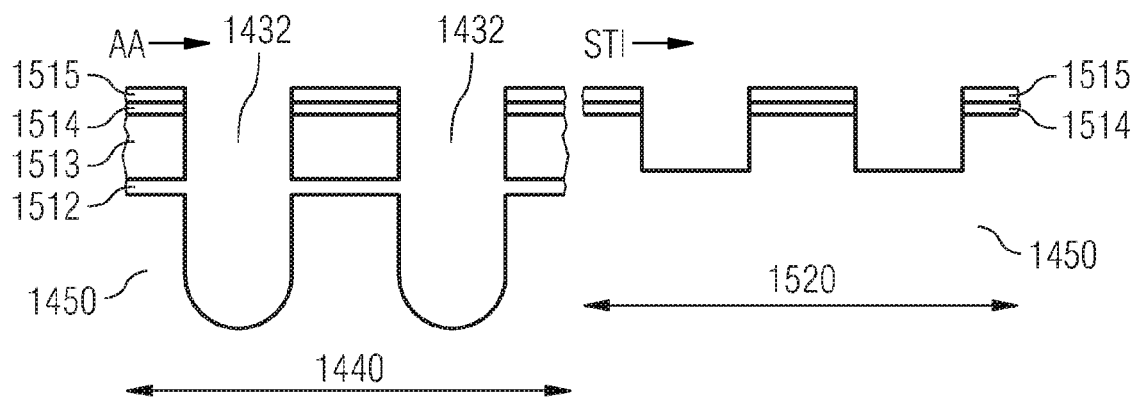
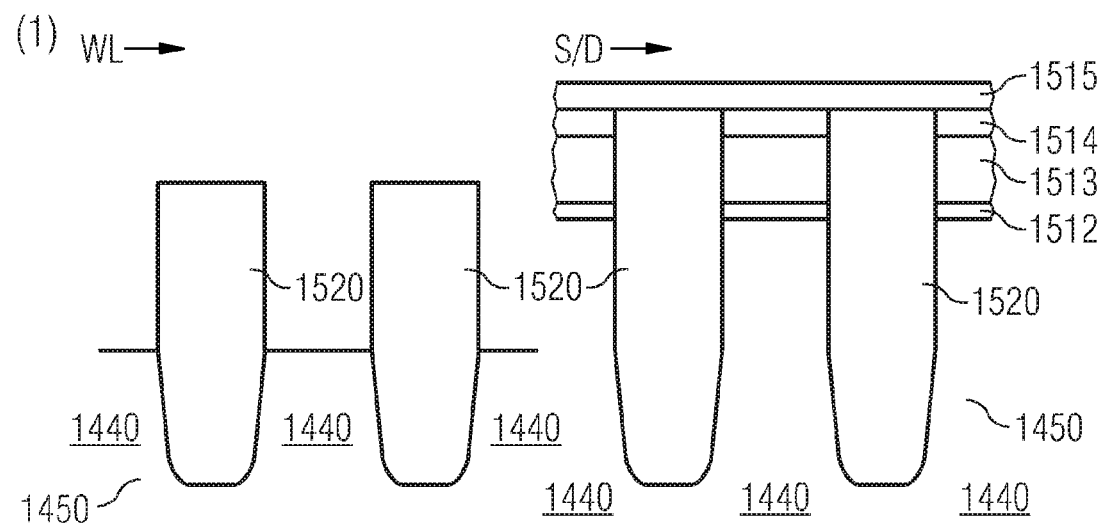

FIG 15C
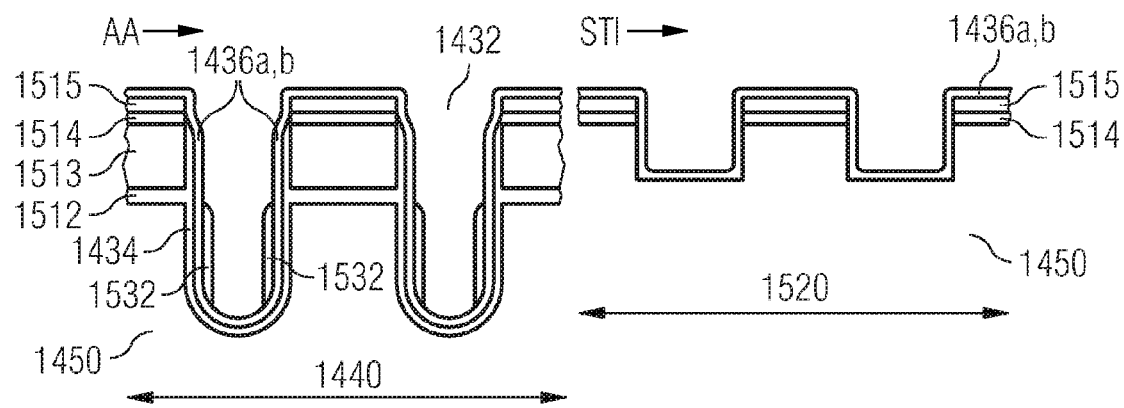
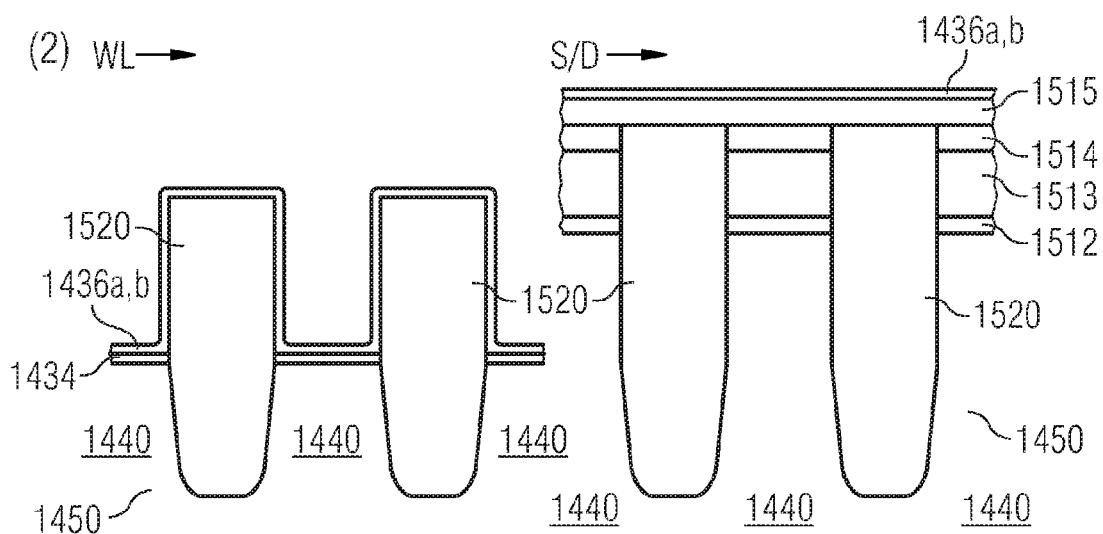

FIG 15D
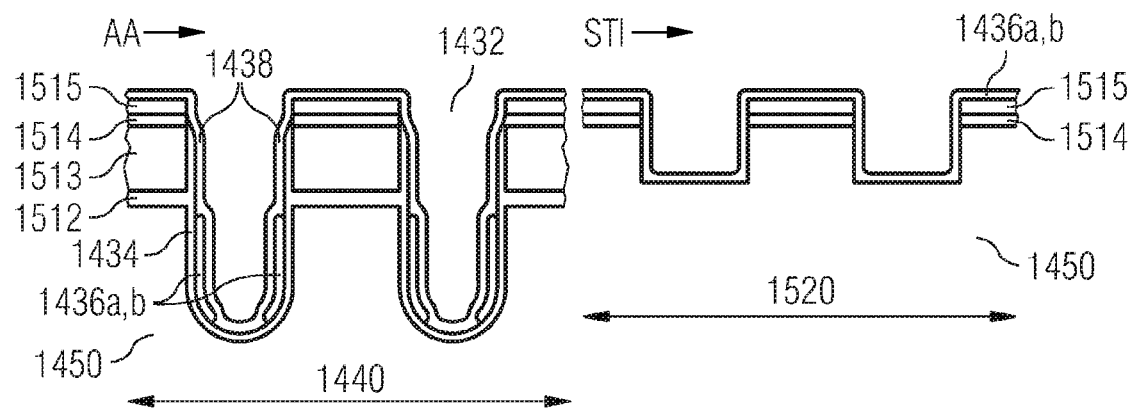
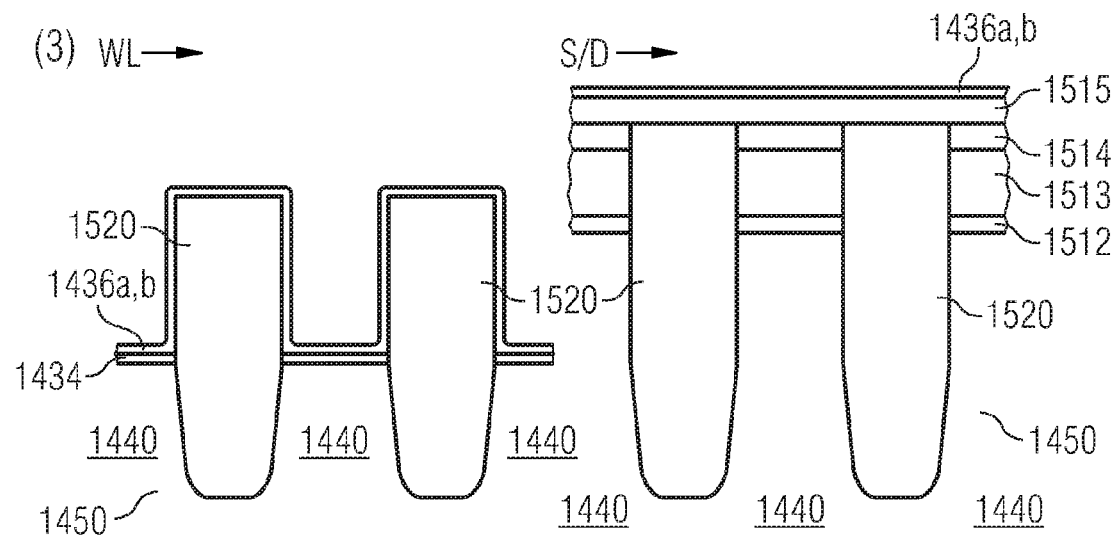

FIG 15E
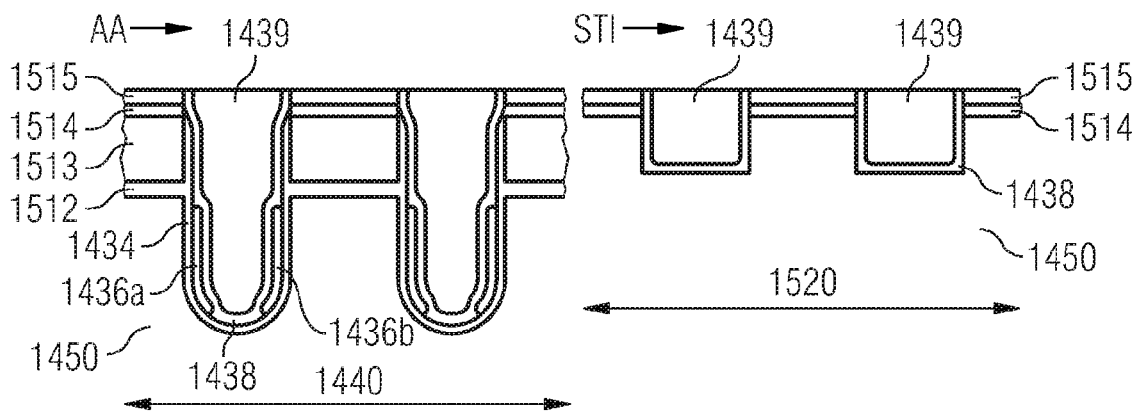
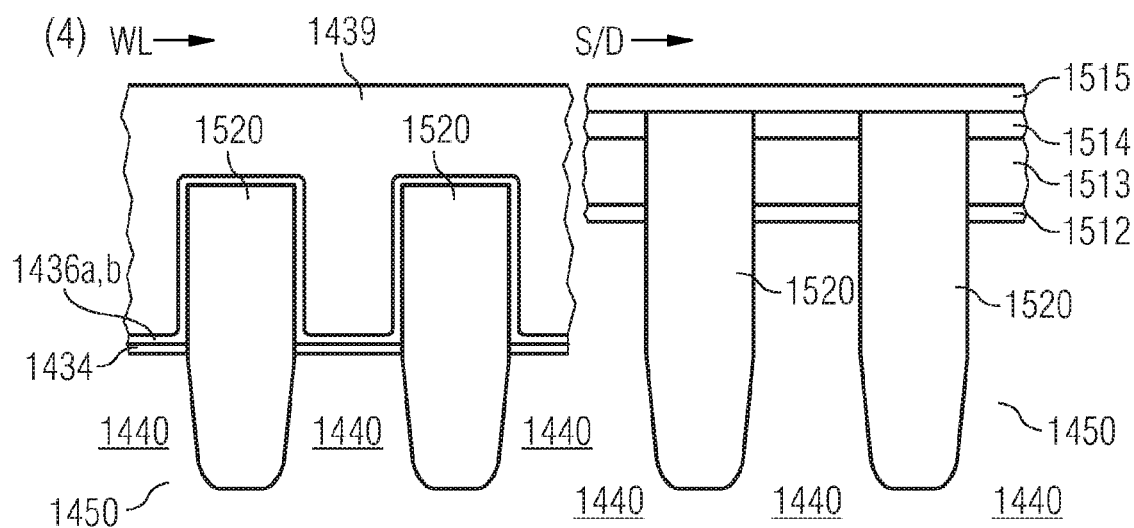

FIG 15F
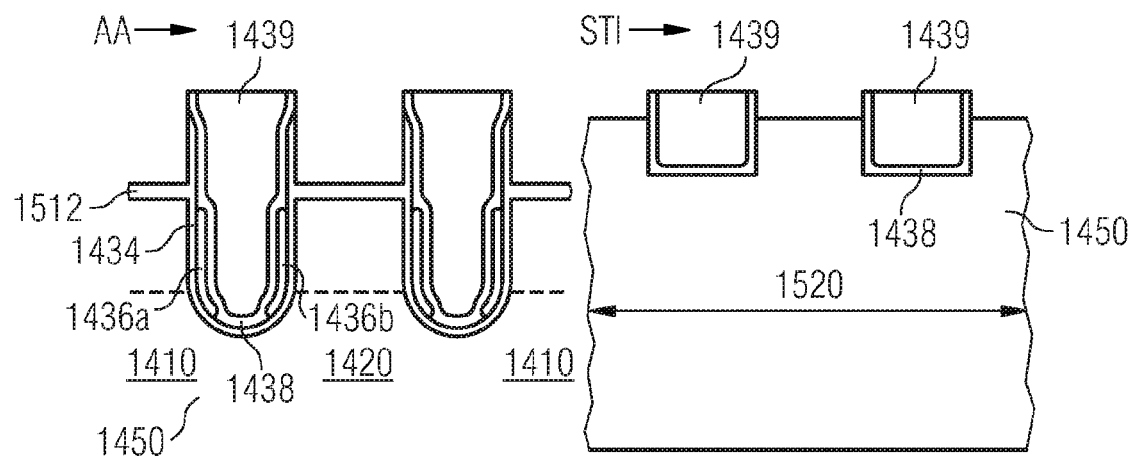
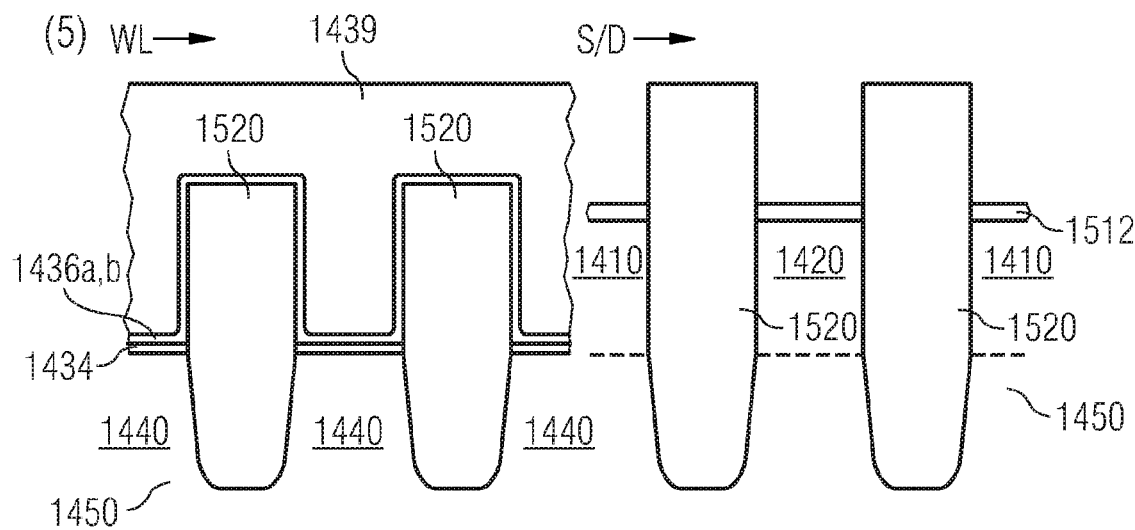

FIG 15G
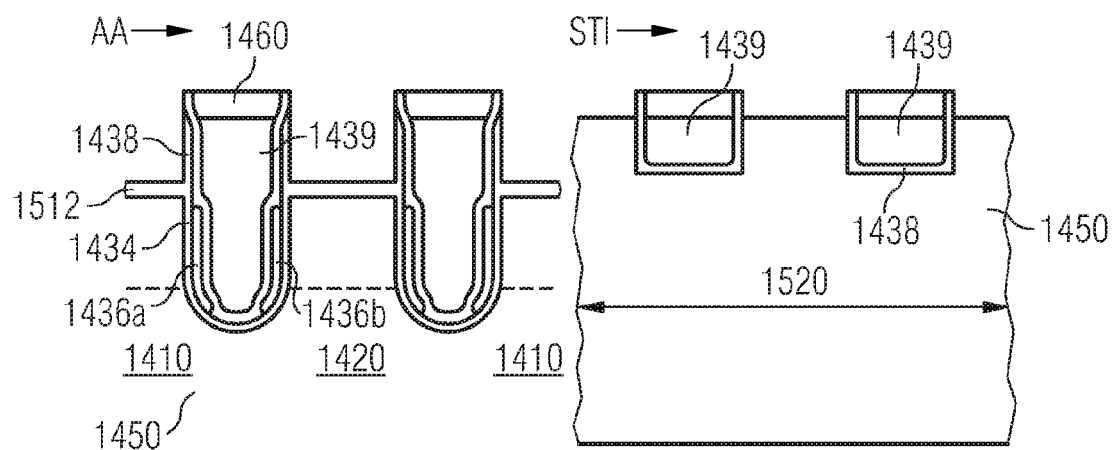
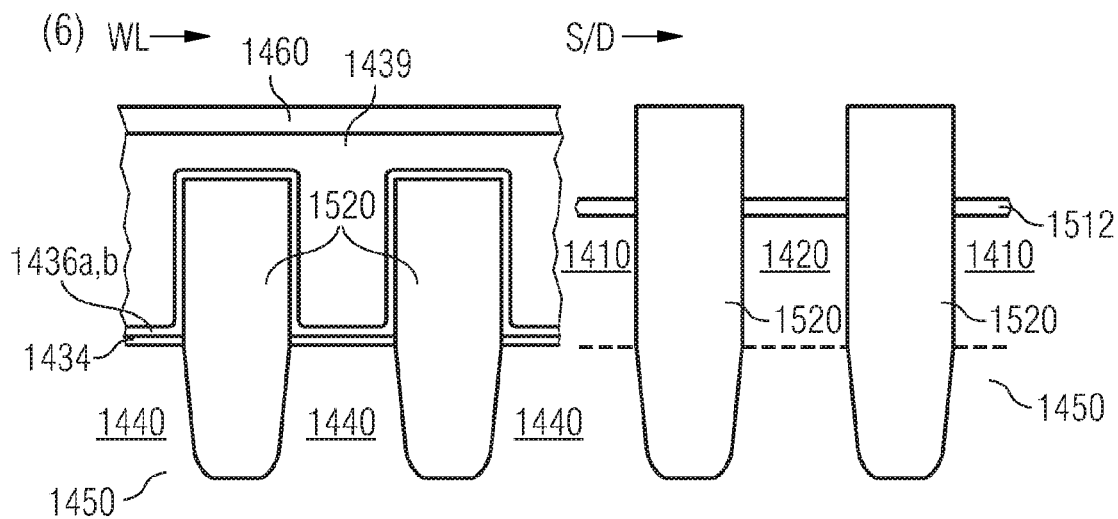

US 7,778,073 B2

INTEGRATED CIRCUIT HAVING NAND MEMORY CELL STRINGS

TECHNICAL FIELD

Embodiments of the present invention relate generally to integrated circuits and methods for manufacturing an integrated circuit.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 7 shows a circuit scheme according to FIG. 1 for still another embodiment of the inventive memory device;

FIG. 12 shows a circuit diagram representing a NAND string with a memory cell to be written;

FIG. 13 shows a circuit diagram representing the mirror NAND string corresponding to the NAND string of FIG. 12;

FIGS. 15A to 15G show cross-sectional views of an array portion employing the recessed channel memory cell shown in FIG. 14A in various states of manufacture in accordance with an embodiment of the invention;

DETAILED DESCRIPTION OF ILLUSTRATIVE EMBODIMENTS

As used herein the terms connected and coupled are intended to include both direct and indirect connection and coupling, respectively.

Figure 1:
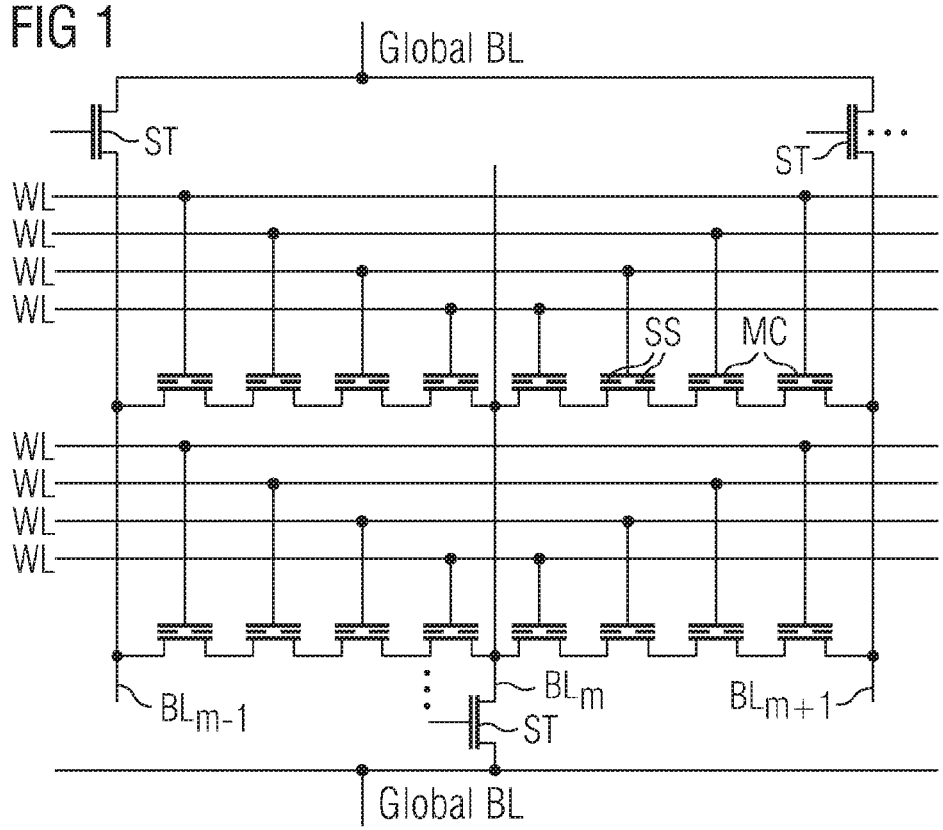
FIG. 1 shows a circuit scheme of an embodiment of the invention.

In an embodiment of the invention, a memory cell arrangement is provided having charge-trapping memory cells that are arranged and connected as a virtual-ground NAND array, in general, as a non-volatile NAND array. A "non-volatile memory cell" may be understood as a memory cell storing data even if it is not active. In an embodiment of the invention, a memory cell may be understood as being not active, e.g., if current access to the content of the memory cell is inactive. In another embodiment, a memory cell may be understood as being not active, e.g., if the power supply is inactive. Furthermore, the stored data may be refreshed on a regular timely basis, but not, as with a "volatile memory cell" every few picoseconds or nanoseconds or milliseconds, but rather in a range of hours, days, weeks or months. Alternatively, the data may not need to be refreshed at all in some designs. FIG. 1 shows a circuit scheme of a section of a first embodiment. This scheme shows a number of memory cells MC that is part of the memory cell array. Every memory cell MC is a charge-trapping memory cell, which comprises two storage sites SS adjacent to both source/drain junctions. In FIG. 1, the memory cells are drawn on a horizontal line, which might not represent the actual physical arrangement of the memory cells within the array. The word lines WL run along the rows of memory cells, and the bit lines BL (in FIG. 1 are shown a first bit line $BL_{m-1}$, a second bit line $BL_m$ and a third bit line $BL_{m+1}$) run along the columns, transversely to the word lines. The memory cells shown in the section of FIG. 1, which are situated between bit lines $BL_{m-1}$, and $BL_m$, all belong to the same column of memory cells. Their sequence along a string can be inferred from their connections to the drawn word lines. The bit lines are coupled to either of two global bit lines by means of selection transistors ST. The memory cells are coupled in series between the connections of two neighboring bit lines. In this example, every NAND string (in the following also referred to as NAND memory cell string, which may refer to a plurality of serially source-to-drain coupled memory cells) comprises four memory cells. The programming is effected by hot hole injection, because the source/drain voltage of the memory cells along the series connection is unfavorably low for a conventional channel hot electron injection.

Figure 2:
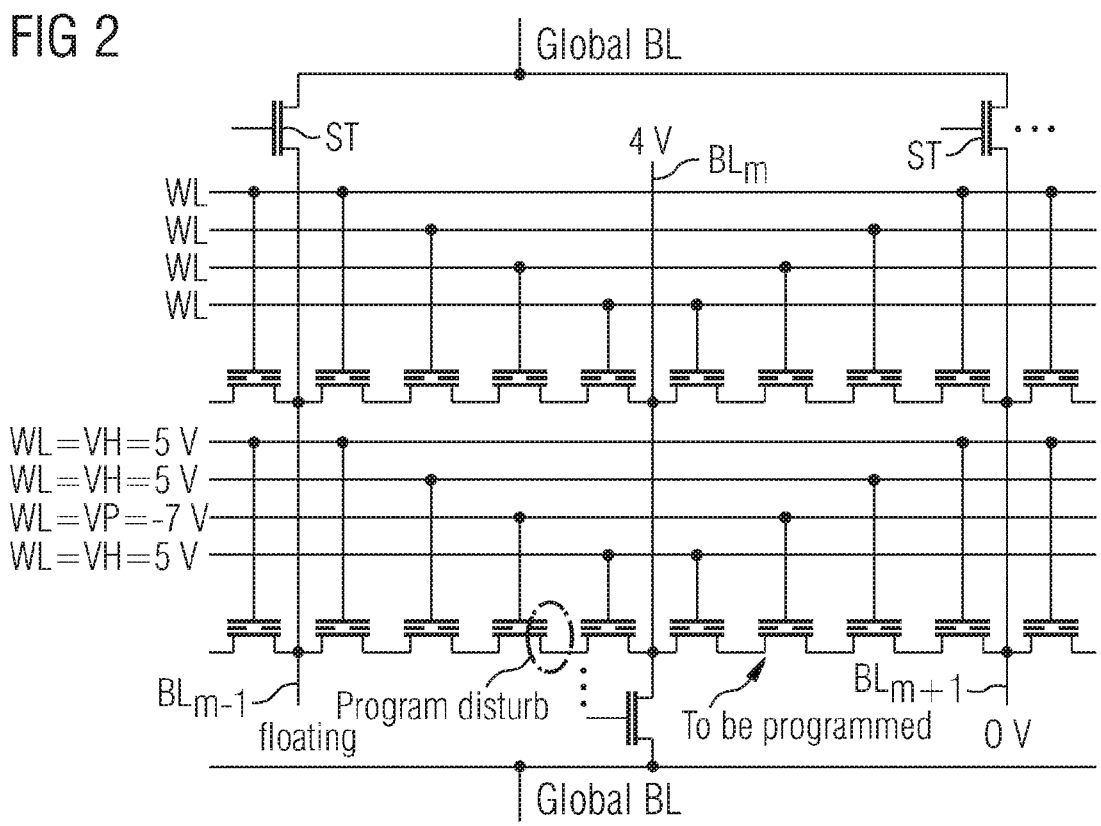
FIG. 2 shows the circuit scheme according to FIG. 1 with programming voltages of a direct approach to a programming process by hot hole injection.

FIG. 2 shows the circuit scheme according to FIG. 1 with the programming voltages inserted. The memory cell and the storage site that is to be programmed are indicated by the arrow on the right side. On the same side (right hand side of the second bit line $BL_m$ in FIG. 2) as the storage site to be programmed, the write voltage of 4 V is applied to the source/drain junction at the end of the NAND string (e.g., by means of an application of the write voltage of 4 V to the second bit line $BL_m$ and thereby to the source/drain junction of the first memory cell of the NAND string seen from the perspective of the second bit line $BL_m$). The other end of the NAND string is set to 0 V (e.g., by means of an application of 0 V to the third bit line $BL_{m+1}$ and thereby to the source/drain junction of the last memory cell of the NAND string seen from the perspective of the second bit line $BL_m$). The gate junctions are set to a high voltage VH of typically, for example, 5 V, except for the gate junction of the memory cell to be programmed, which is set to the programming voltage VP of typically, for example, −7 V, via the word line WL. Although the next bit line, for example, the third bit line $BL_{m+1}$, is on floating potential, a program disturb (indicated in FIG. 2 by means of a circle) is to be expected at the mirror cell of the programmed cell between the write voltage and the floating potential. This problem is avoided by a special operation mode and thus a special circuitry, which are adapted to this memory cell array and will be described in detail in connection with FIG. 4.

Figure 3:
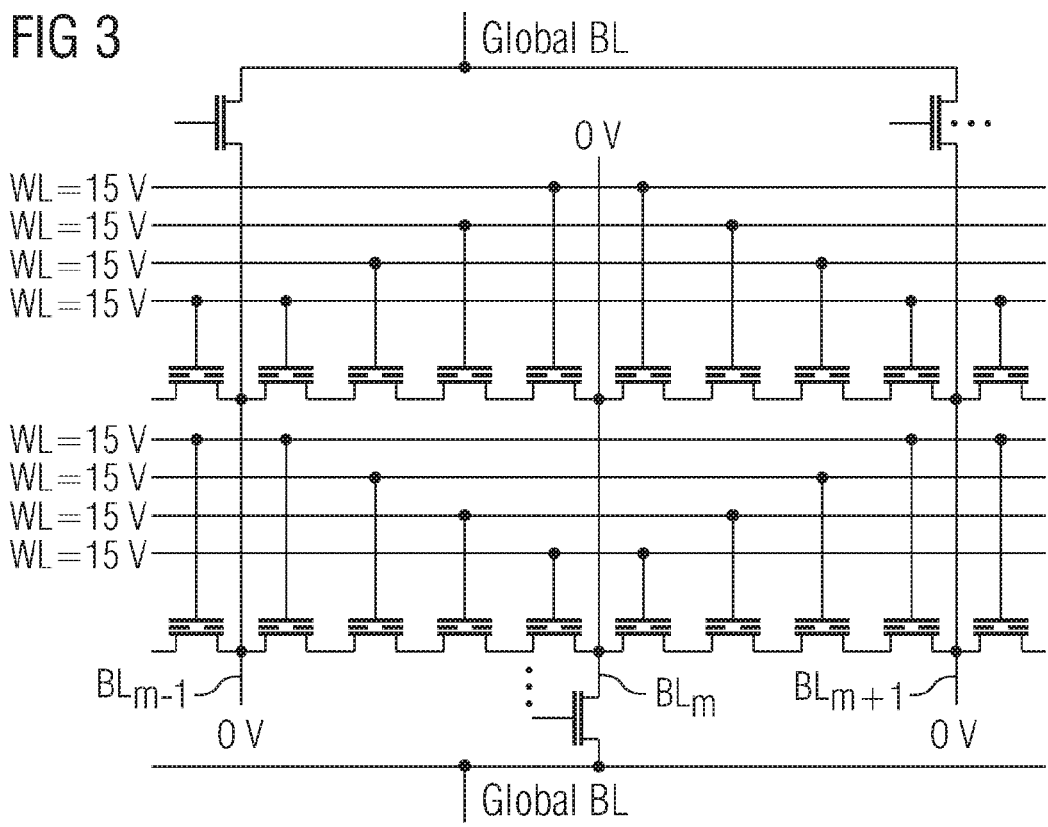
FIG. 3 shows a circuit scheme of a further embodiment of the inventive memory device for the erase operation.

FIG. 3 shows a circuit scheme according to FIG. 1 of another embodiment for the erase operation with the voltages inserted according to the special operation mode. All the word lines WL are set to a high voltage, typically, for example, 15 V. If a lower voltage, in this example 0 V, is applied to the bit lines $BL_{m-1}$, $BL_m$, $BL_{m+1}$, and to the substrate, Fowler-Nordheim tunneling of electrons commences from the channel region of the memory cells into the memory layer so that the threshold voltage of the memory transistors is increased. When the threshold voltage is sufficiently high, all the memory cells are in a state that is regarded as erasure.

Figure 4:
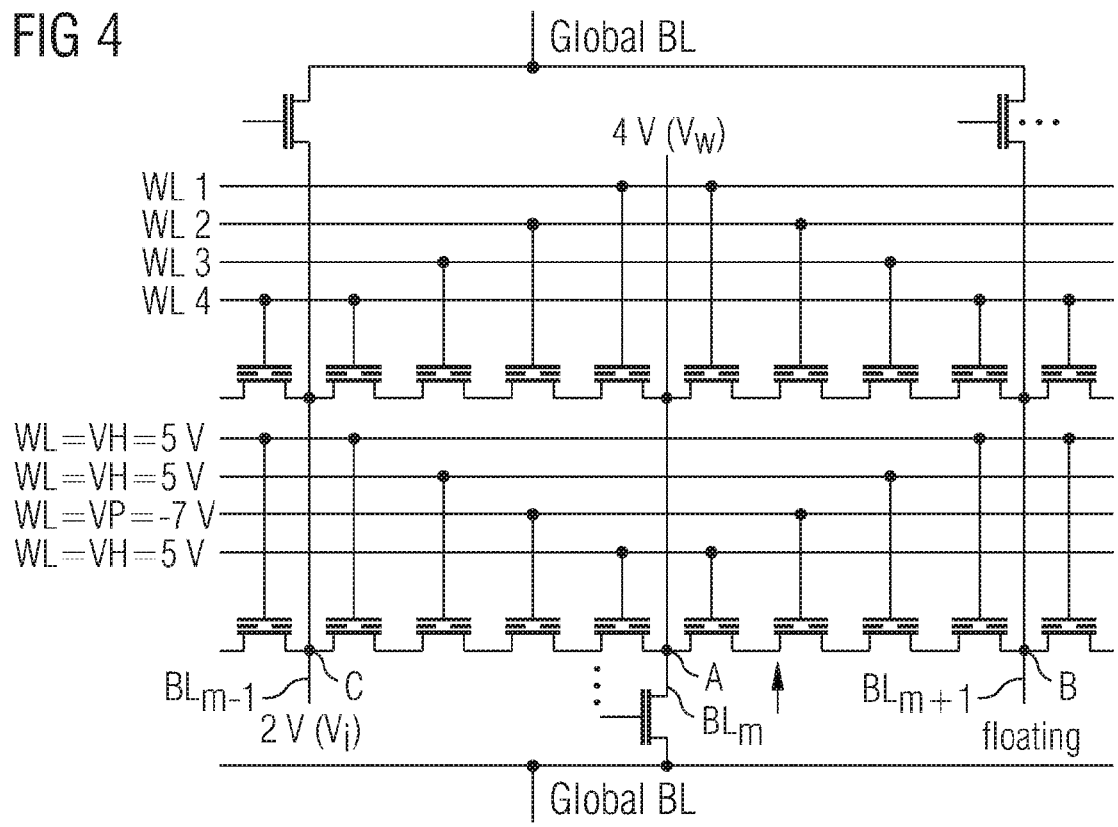
FIG. 4 shows the circuit scheme according to FIG. 3 for the write operation with inhibit.

FIG. 4 shows the circuit scheme according to FIG. 3 for the write operation. The word line of the selected cell, which is to be programmed, is set to a suitable negative voltage, the programming voltage VP of typically, for example, −7 V. The other memory cells of this NAND string are switched open by a suitable positive voltage, for example the high voltage VH of typically 5 V. In order to obtain a hot hole injection, the source/drain junction at the storage site of the selected memory cell, where the programming has to be effected, has to be set to a positive write voltage $V_w$ of typically, for example, 4 V. Therefore, the bit line that is coupled to the source/drain junction A shown in FIG. 4 (e.g., the second bit line $BL_m$) is set to 4 V if, for instance, the storage site that is indicated by the arrow pointing upwards is to be programmed, while the bit line that is coupled to the other end of the NAND string (connection B) (e.g., the third bit line $BL_{m+1}$) is maintained on floating potential. The floating potential is usually 0 V because the non-addressed bit lines are maintained on 0 V and the write operation is short so that the floating potential does not change essentially during this short time interval. In any case, the potential difference between the source/drain junctions of the memory cell that is to be programmed is large enough in order to generate holes by means of the so-called GIDL (gate induced drain leakage) effect. These holes are subsequently injected into the memory layer. This means that the threshold voltage of the selected memory cell is decreased on the relevant side so that the state of the relevant storage site is changed into the programmed state.

If no countermeasures are taken, an undesired programming occurs in the memory cell that is located in a mirror position with respect to the bit line that is set to the write voltage (e.g., with respect to the second bit line $BL_m$). The undesired write operation is inhibited by the application of an inhibit voltage $V_i$, typically about 2 V, for example, to the next bit line connection C at the other end of the mirror NAND string (e.g., the first bit line $BL_{m-1}$). In any case, the inhibit voltage is chosen so that no memory cell of the NAND strings that end at the connection C is programmed. The voltage difference of 2 V between the write voltage $V_w$ and the inhibit voltage $V_i$, and between the inhibit voltage $V_i$ and the floating potential of approximately 0 V is too small to generate a hot hole injection in the memory cells of the NAND strings that end at connection C. The threshold voltages of these memory cells thus remain basically unchanged. By means of the inhibit voltage $V_i$, a program disturb of memory cells that are addressed by the same word line, but are not to be programmed, can be avoided. This operation mode enables an appropriate operation of the memory cell architecture in accordance with an embodiment of the invention, thus securing adequate performance even in an array of extremely increased storage density.

Figure 5:
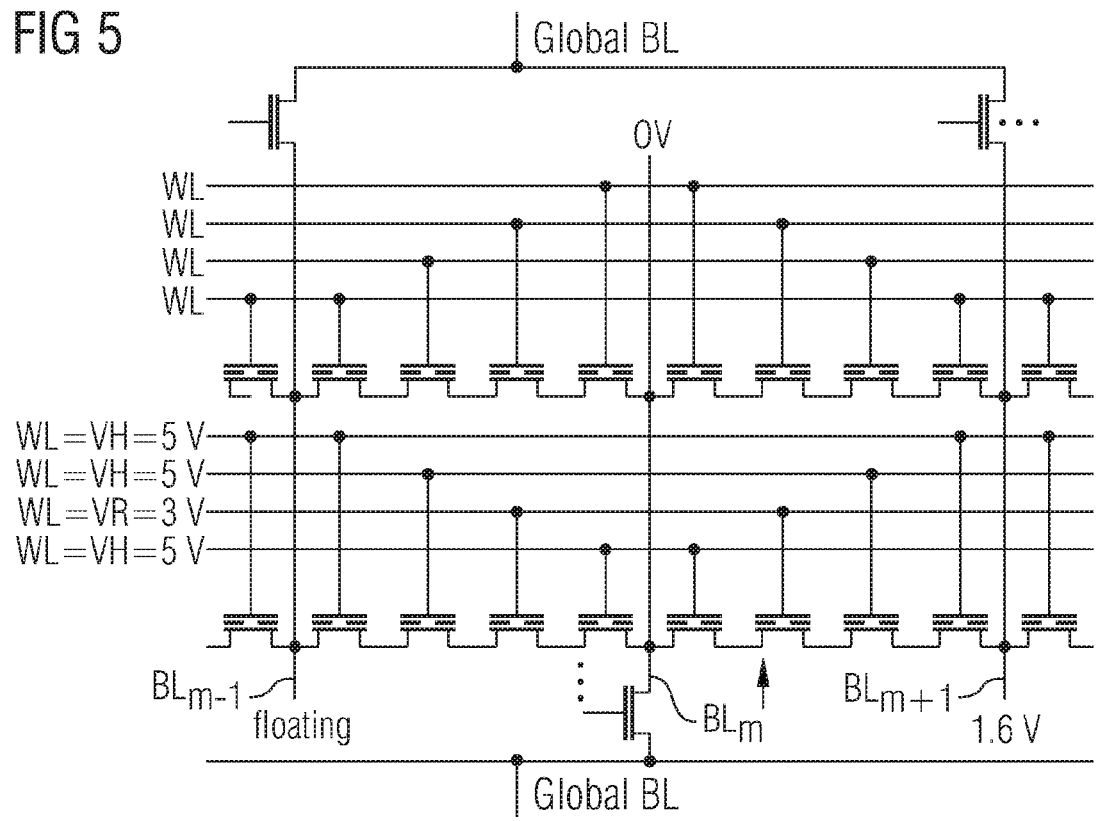
FIG. 5 shows the circuit scheme according to FIG. 3 for the read operation.

The read operation is performed according to the circuit scheme of FIG. 5, which shows the appropriate voltages. The word line, which addresses the memory cell that is to be read, is set to the read voltage VR of typically, for example, 3 V. The other word lines of the same NAND string are set to the high voltage VH of typically, for example, about 5 V. The storage site that is to be read is indicated by the arrow pointing upwards in FIG. 5. The bit line (e.g., the second bit line $BL_m$) that was set to the write voltage in the programming of this storage site is set to a low potential, typically 0 V, while the bit line (e.g., the third bit line $BL_{m+1}$) at the other end of the NAND string is set to an appropriate drain voltage of typically, for example, 1.6V.

Due to the generated space-charge region in the selected memory cell on the side of the drain voltage, the influence of the non-selected storage site of this memory cell is sufficiently small. Therefore, the current through this memory cell is essentially defined by the selected storage site to be read, and can be evaluated to check the programmed state of this storage site and thus to read the stored bit of information. In this way, the two storage sites of the 2-bit charge-trapping memory cells can be distinguished in the read operation.

The typical voltages that are applied in the write and read operations are repeated in the following table for easy reference.

| connection | operation | |
|---|---|---|
| | write | Read |
| gate of the selected cell | −7 V | 3 V |
| other gates of the selected NAND string | 5 V | 5 V |
| source/drain of the selected cell, addressed side (A) | 4 V (Vw) | 0 V |
| source/drain of the selected cell, non-addressed side (B) | floating (≈0 V) | 1.6 V |
| source/drain of the disturbed cell, side opposite selected cell (C) | 2 V (Vi) | floating |
| Bulk | 0 V | 0 V |

Figure 6:
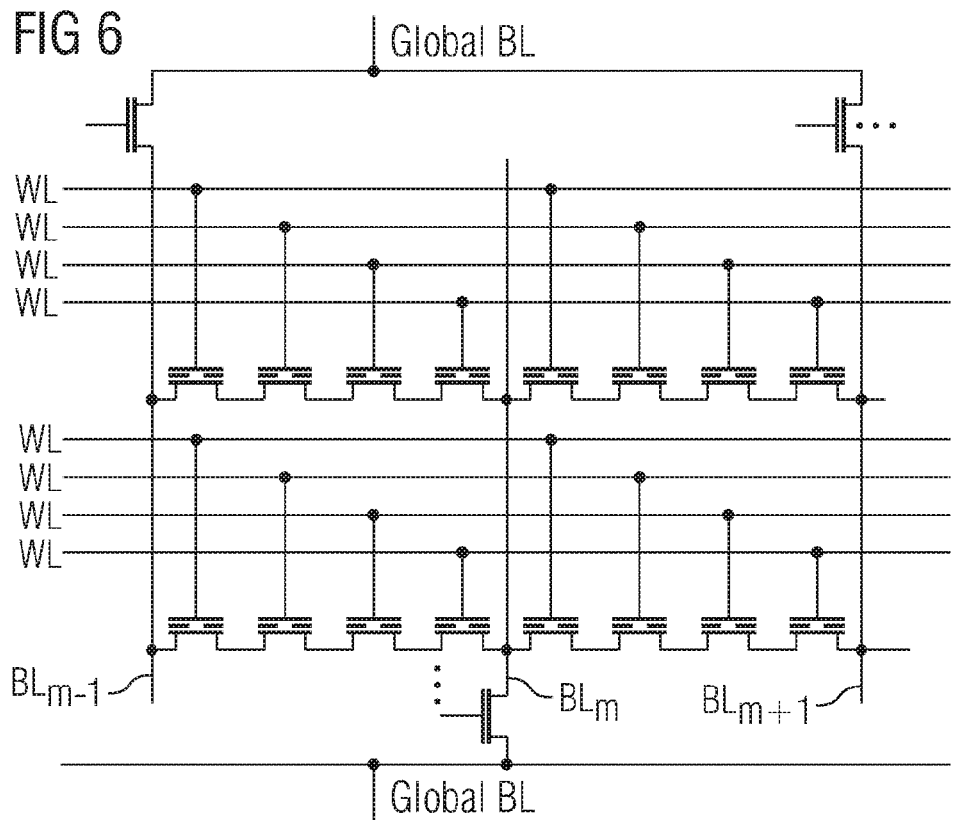
FIG. 6 shows a circuit scheme according to FIG. 1 for another embodiment of the inventive memory device.

FIG. 6 shows the circuit scheme for another embodiment of the array, in which the sequence of the connections of the word lines is not axis-symmetric to the second bit line $BL_m$ as in the first embodiment. The sequence of connections of the word lines is repeated after every connection to a bit line. Thus, the sequence of connections is periodical from one bit line to the next one. The operation modes, which have been described in connection with the first embodiment, are applied to this second embodiment in a corresponding way. The applied voltages can be the same; only the location of the memory cell, in which a program disturb would occur if no inhibit voltage were applied, is changed.

FIG. 7 shows the circuit scheme for another embodiment of the array, in which the sequence of connections of the word lines is repeated after every connection to a bit line. This embodiment differs from the embodiment according to FIG. 6, which will become apparent from the following description of the plan views of exemplary device structures.

Figure 8:
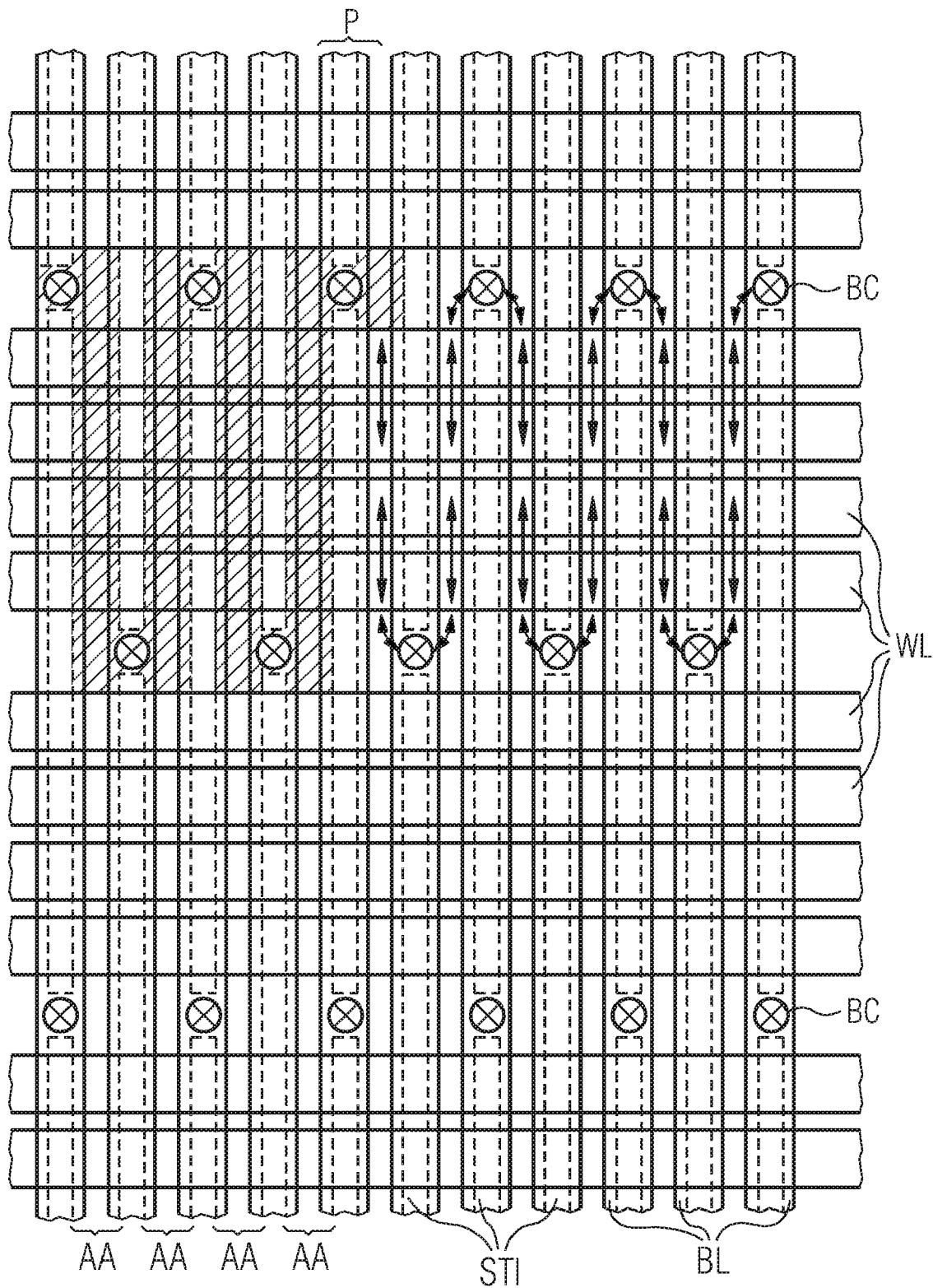
FIG. 8 is a plan view of an embodiment of the inventive memory device according to the circuit scheme of FIG. 4, showing the arrangement of the NAND strings, bit lines and word lines.

FIG. 8 is a plan view of an embodiment of the memory device according to the circuit scheme of FIG. 3. It shows the arrangement of the NAND strings, the bit lines and the word lines in a schematic fashion. The memory cells are arranged in active areas AA of the substrate, which are separated by shallow trench isolations STI. The boundaries of the shallow trench isolations are shown by the parallel broken lines that are in close vicinity. The word lines WL run along the rows of memory cells and cover essentially the channel regions. The source/drain regions are arranged on both sides of the word lines, e.g., can be self-aligned. The source/drain regions, which form the source/drain junctions of the memory cells, are common to memory cells that are subsequent along the columns. In this way, the memory cells are arranged in series to form the NAND strings between two subsequent bit line connections BC. The bit lines BL run along the columns of memory cells and are arranged parallel at a distance from one another as straight strips. The pitch p of the memory cell array is indicated between the corresponding boundaries of two neighboring bit lines.

The bit line connections BC are arranged in such a manner that every bit line is coupled to the source/drain junctions that are common to the four adjacent memory cells that are arranged in a square. Along each of the columns, the source/drain junctions that are contacted by bit lines are alternatingly coupled to the two neighboring bit lines. Every NAND string in the example shown in FIG. 7 includes four memory cells, and all NAND strings belong to the same groups of rows, which in this example all include four rows and four word lines. The ends of the NAND strings are also ends of the NAND strings that follow on both sides in the same column. Within the same group of rows, the NAND strings form a sequence of NAND strings, which are coupled in series by their common source/drain junctions, which are coupled by the bit lines. This is highlighted in FIG. 8 by the hatching of a sequence of NAND strings on the left side, which is also indicated by the sequence of double arrows on the right side. This sequence of double arrows corresponds to the arrangement of memory cells that are shown on a straight horizontal line in FIGS. 3 to 5.

Figure 9:
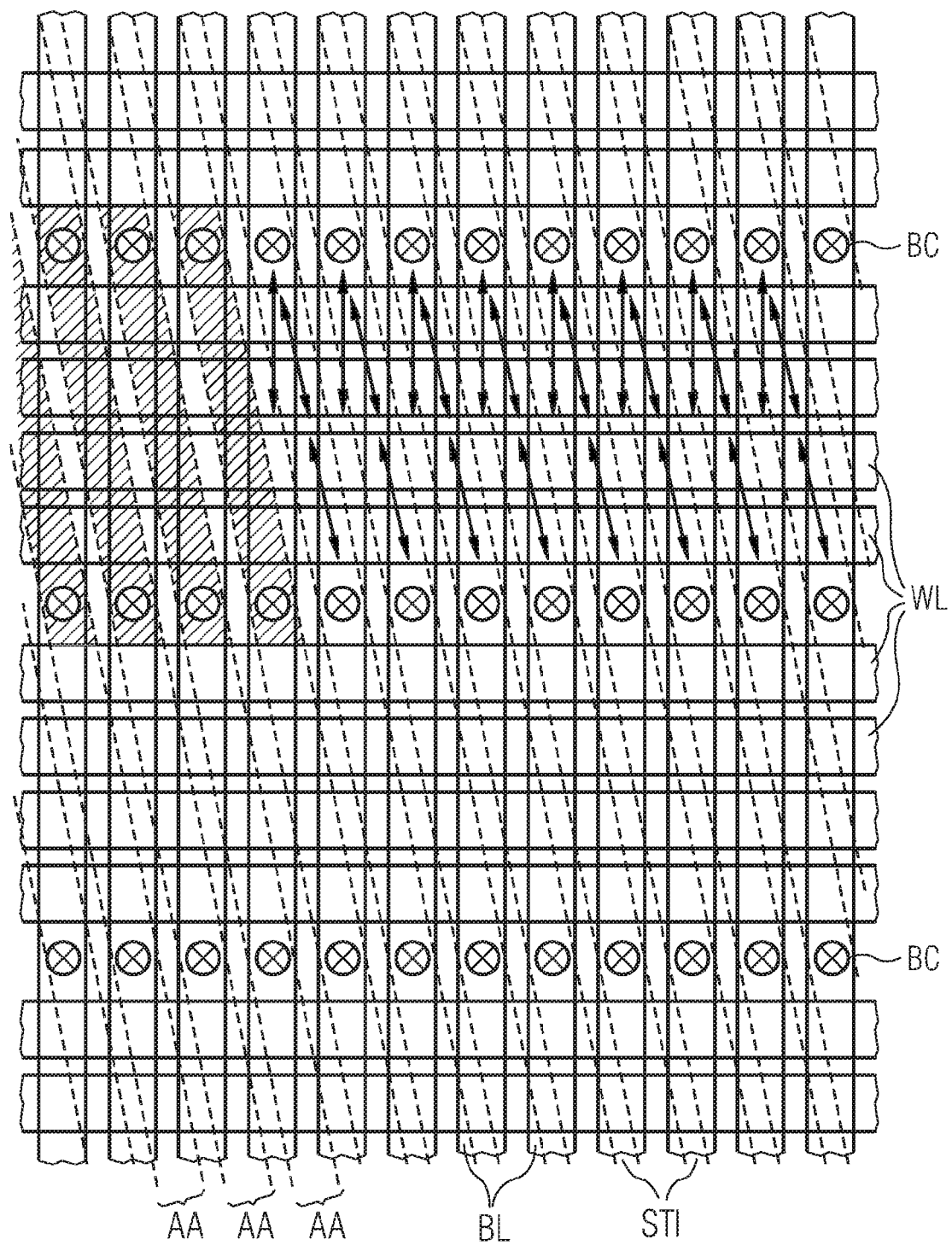
FIG. 9 is a plan view according to FIG. 8 of an embodiment according to the circuit scheme of FIG. 6.

FIG. 9 is a plan view according to FIG. 8 for an embodiment according to the circuit scheme of FIG. 6. The columns of memory cells are arranged in active areas AA at a small angle to the straight bit lines BL, which are arranged transversely to the word lines WL. Following a column from top to bottom in FIG. 9, the subsequent bit line connections BC couple the source/drain junctions of the selection pertaining to the relevant column to subsequent bit lines, following one another from left to right in the example shown in FIG. 9.

Figure 10:
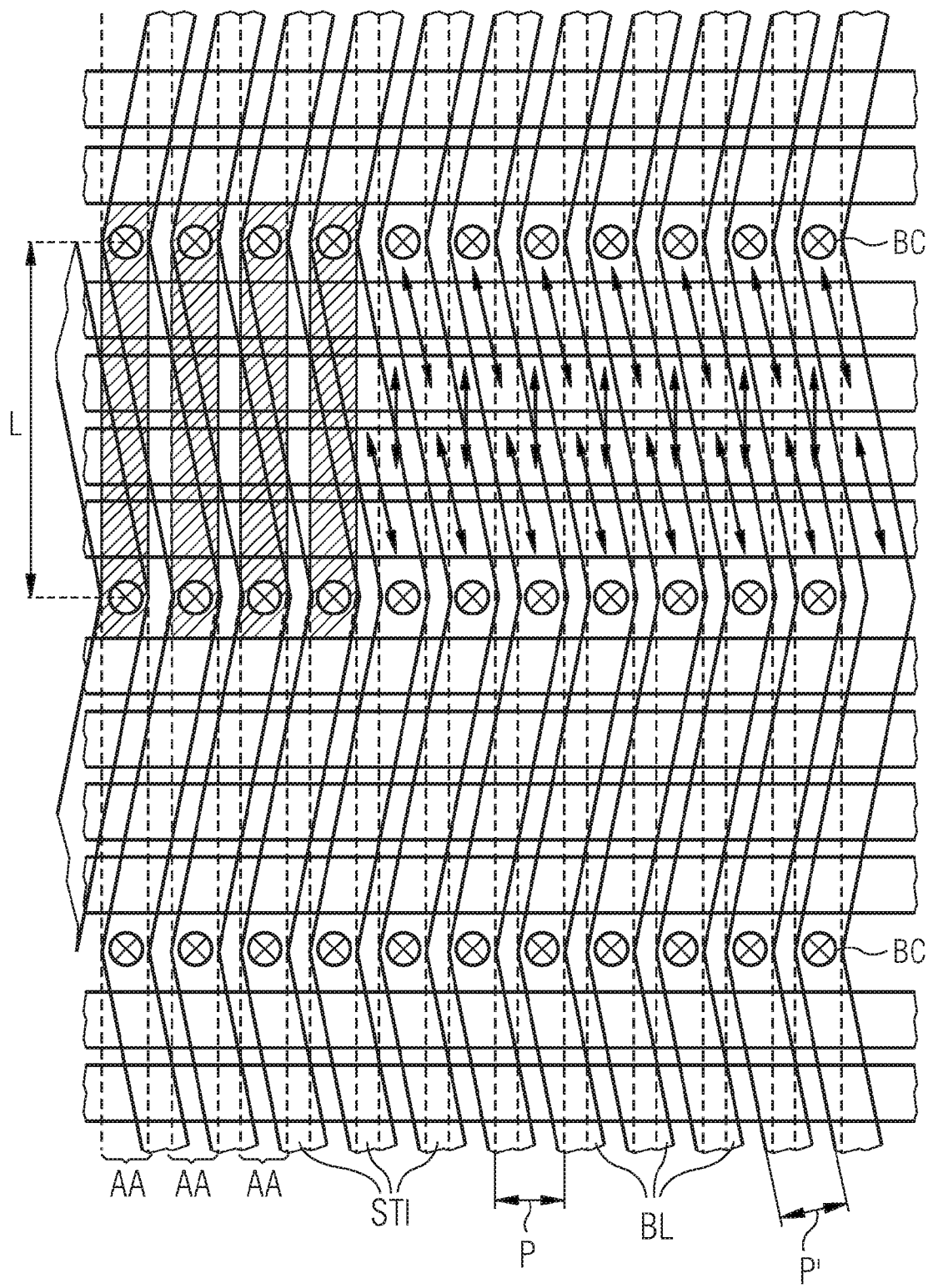
FIG. 10 is a plan view according to FIG. 8 of an embodiment according to the circuit scheme of FIG. 7.

FIG. 10 is a plan view according to the structure shown in FIG. 8 for an embodiment according to the circuit scheme of FIG. 7. In this embodiment, the bit lines BL run in zigzag fashion essentially along the columns. The bit line connections BC along one single bit line are alternatingly coupled to the source/drain junctions of two adjacent columns of memory cells. The sequence of NAND strings, which are shown on horizontal straight lines in FIG. 6, is again highlighted by the hatching. The source/drain junctions at the ends of the NAND strings of this sequence of the second embodiment do not coincide, but are electrically coupled by the bit lines. This can be seen from the double arrows on the right side. The double arrows show the sequence of NAND cells, which are arranged along the double arrows that are directed vertically, and which are coupled by sections of the bit lines, which are indicated by the slightly tilted double arrows. The pitch p of the memory cell array and the pitch p' of the bit lines are indicated in the FIG. 10, as well as the longitudinal dimension L of the NAND strings along the columns, including proportionate parts of the bit line contacts on the source/drain junctions at the ends of the NAND strings.

Figure 11:
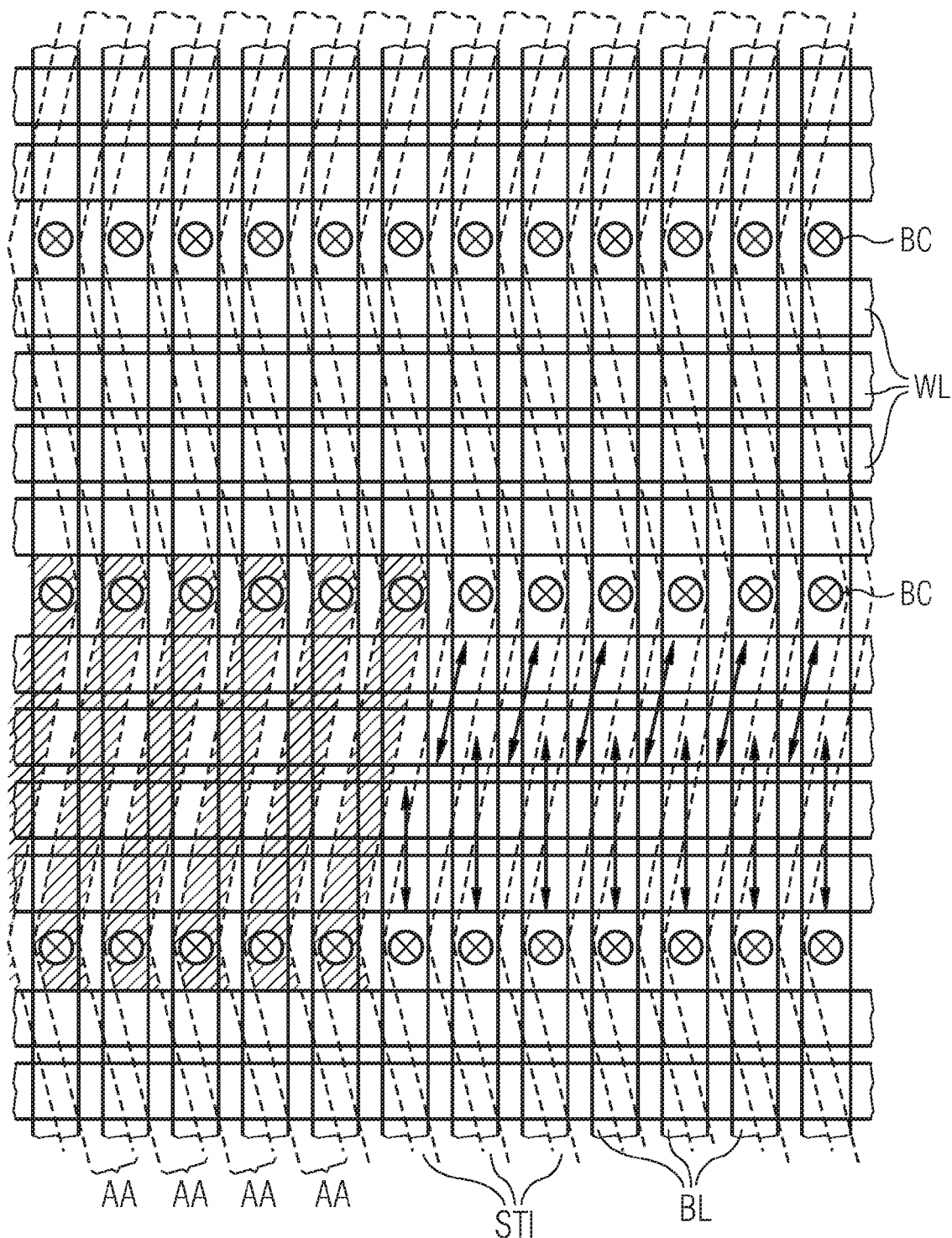
FIG. 11 is a plan view according to FIG. 8 of a further embodiment according to the circuit scheme of FIG. 7.

FIG. 11 is a plan view according to the structure shown in FIG. 8 for a further embodiment according to the circuit scheme of FIG. 7. In this embodiment, the active areas AA, in which the columns of memory cells are located, are arranged in zigzag fashion, while the bit lines are straight. The relative arrangement of the active areas AA, the bit lines BL, and the bit line connections BC is comparable to the embodiment of FIG. 10. It is also possible to have both the active areas and the bit lines deviate from the strictly straight arrangement, in order to be able to further minimize the required device area, according to the minimal pitch that can be realized by the process technology.

The different resistances of the electric connections to the different memory cells result in a larger distribution of the threshold voltages of the programmed memory cells. This can be compensated either by the number of programming pulses, combined with a verify operation, which consumes operation time, or by a local adaptation of the programming conditions. The latter possibility will be described in more detail. This method adapts the voltages during the write operation to the localization of the written memory cell within the NAND string.

FIG. 12 shows a circuit diagram representing a NAND string between the connections A and B indicated in FIG. 4. The memory cells are enumerated in the direction from connection B to connection A by the numbers 0, 1, 2, ..., n−1, n, and are represented by their resistances $R_0, R_1, R_2, \ldots, R_n$. If the left storage site of memory cell number k, having resistance $R_k$, is to be programmed, for instance, the write voltage $V_w$ has to be applied to the left source/drain junction of the k-th memory cell, which is located on the side of connection A, and in an embodiment of the invention, a floating potential may be applied to the right source/drain junction of the k-th memory cell, which is located on the side of connection B. The floating potential at connection B can be regarded to be 0 V, which is the usual bit line voltage that is applied to the bit lines in the intervals between the write and read operations.

As the gate junction of the k-th memory cell is set to a negative potential, in the example to −7 V, this memory cell has a high resistance $R_k = R_{write}$. The other memory cells of this NAND string are switched open by means of the high voltage of typically 5 V at their gate junctions. Therefore, all the other resistances $R_0, R_1, R_2, \ldots, R_{k-1}, R_{k+1}, \ldots, R_n$ have low values, which can be taken to be the same average value, denoted in the following by $R_{average}$. The series of resistances shown in FIG. 12 functions as a potential divider between the connections A and B. In order to have the desired write voltage $V_w$ at the designated position of the storage site to be programmed, it is necessary to apply a larger voltage $c_1 V_w$ to connection A. The value of the constant $c_1$ can be calculated according to the standard laws of electric circuits.

FIG. 13 shows the mirror NAND string between the connections A and C as indicated in FIG. 4. The mirror memory cells are enumerated in the direction from connection C to connection A by the numbers 0, 1, 2, ..., n−1, n, and are represented by their resistances $R'_0, R'_1, R'_2, \ldots, R'_n$. The inhibit voltage $V_i$ has to be applied to the left-hand side of the k-th mirror memory cell, which is represented in the circuit diagram of FIG. 13 by its resistance $R'_k = R_{inhibit}$. The resistances $R'_0, R'_1, \ldots, R'_{k-1}, R'_{k+1}, \ldots, R'_n$ of the other mirror memory cells can be taken as equal to $R_{average}$. The constant $c_2$ can be calculated in a standard way in order to find the voltage that has to be applied to connection C, if the voltage $c_1 V_w$ is applied to connection A and the k-th memory cell of the mirror NAND cell has to be set to the inhibit voltage $V_i$.

The calculation is as follows. If $R_i$ denotes the resistance of the memory cell number i, counted from connection B to connection A, i integer and $0 \leq i \leq n$, and $R'_i$ denotes the resistance of the mirror memory cell number i on the opposite side of the connection A, counted in the opposite sense from connection C to connection A, let $$R = R0 + R1 + R2 + \ldots + Rk + \ldots + Rn-2 + Rn-1 + Rn,$$

$$Ri;j = Ri + Ri+1 + Ri+2 + \ldots + Rj-2 + Rj-1 + Rj,$$

$$R' = R'0 + R'1 + R'2 + \ldots + R'k + \ldots + R'n-2 + R'n-1 + R'n,$$
and $$R'i;j = R'i + R'i+1 + R'i+2 + \ldots + R'j-2 + R'j-1 + R'j,$$

where i and j are integers and $0 \leq i \leq j \leq n$.

If cell number k, $0 \leq k \leq n$, is to be programmed, and $V_w$ denotes the write voltage and $V_i$ the inhibit voltage, $$c_1 = R/R_{0;k} \text{ and } c_2 = (R' - c_0 R'_{0;k-1})/R'_{k;n} \text{ with } c_0 = c_1 \cdot V_w / V_i.$$

With the notation $R_k = R_{write}$, $R'_k = R_{inhibit}$ and the assumption $R_i = R'_i = R_{average}$ for $i \neq k$, $$c_1 = (R_{write} + n \cdot R_{average})/(R_{write} + k \cdot R_{average}) \text{ and}$$

$$c_2 = (R_{inhibit} + (n - c_0 \cdot k) \cdot R_{average})/(R_{inhibit} + (n-k) \cdot R_{average}).$$

This multi-bit memory device in accordance with an exemplary embodiment of the invention provides an arrangement of charge-trapping flash memory cells in a virtual-ground NAND array in different kinds of architecture. An exemplary operation mode is applied to the structure and layout of the arrangement. The following effects result from these features in accordance with various embodiments of the invention: the combination of charge-trapping flash memory cells in a virtual-ground NAND array enables a high storage density; because of the positive threshold voltages, no selection transistor is necessary within the NAND strings, contrary to conventional NAND arrays; and the low power consumption, due to an operation mode on the basis of hot hole injection, enables the application of this memory device as a data memory. As used herein the term "multi-bit" memory cell is intended to e.g., include memory cells which are configured to store a plurality of bits by spatially separated electric charge storage regions or current conductivity regions, thereby representing a plurality of logic states.

In an embodiment of the invention, the memory cells may be configured as "multi-level" memory cells. As used herein the term "multi-level" memory cell is intended to, e.g., include memory cells which are configured to store a plurality of bits by showing distinguishable voltage or current levels dependent on the amount of electric charge stored in the memory cell or the amount of electric current flowing through the memory cell, thereby representing a plurality of logic states.

Particular embodiments of a virtual ground NAND memory device of the present invention are further described. In a first embodiment, the memory device includes an array of memory cells arranged in rows and columns, the rows being arranged into groups of the rows, each of the memory cells having a gate junction, two opposite source/drain junctions, and e.g., two separate storage sites, one of the storage sites being located near one of the source/drain junctions and the other one of the storage sites being located near the opposite one of the source/drain junctions. The memory cells of the columns are coupled in series by the source/drain junctions, and a selection of the source/drain junctions are formed by source/drain junctions that are common to memory cells of two adjacent ones of the groups of rows. The array further includes a plurality of bit lines being arranged partially parallel at a distance from one another along the string direction. Additionally, along each of the strings, the selection of source/drain junctions is coupled alternatingly to one of the bit lines and to a neighboring one of the bit lines. In this manner, a plurality of serially-coupled NAND strings of memory cells (i.e., cell strings between adjacent BC bit line contact points) are formed, each of the NAND strings formed along individual strings and from the same group of rows between the selection of source/drain junctions of the NAND string. Within the memory array, each of the word lines coupling the gate junctions of the memory cells of one of the rows.

In another refinement of the first embodiment the bit lines are arranged along the strings in zigzag fashion, and every bit line is alternatingly coupled to source/drain junctions of memory cells of one of two neighboring strings. A further refinement of the first embodiment, each of the groups of rows includes the same number of rows.

In another refinement, the first embodiment may also include an electronic circuit provided for an application of voltages to the gate junction and the source/drain junctions of memory cells in read, write, and erase operations, wherein the electronic circuit is configured to apply a write voltage to any one of the bit lines and an inhibit voltage to a neighboring bit line, the inhibit voltage being appropriate to inhibit a write operation at the memory cells belonging to NAND strings that are coupled to the respective neighboring bit line. Optional additions in this refinement include select transistors being provided as a switch in every bit line, and two global bit lines, whereby every second bit line in succession being coupled to the first one of the global bit lines by means of the select transistors, and the other bit lines being coupled to the second one of the global bit lines by means of the select transistors.

In an embodiment of the invention, the select gates may be arranged within a respective string.

A second embodiment of the virtual ground NAND memory device includes an array of memory cells arranged in rows and columns, the rows being arranged into groups of the rows. Each of the memory cells includes a gate junction, two opposite source/drain junctions, and two separate storage sites, one of the storage sites being located near one of the source/drain junctions and the other one of the storage sites being located near the opposite one of the source/drain junctions. The memory cells of the columns are coupled in series by the source/drain junctions, and a selection of the source/drain junctions are formed by source/drain junctions that are common to memory cells of two adjacent ones of the groups of rows. Bit lines are arranged parallel at a distance from one another at an angle to the columns, and along each of the columns, the selection of source/drain junctions are sequentially coupled to subsequent ones of the bit lines, thus forming NAND strings of memory cells of the same column and the same group of rows between subsequent ones of the selection of source/drain junctions. The array further includes word lines coupling the gate junctions of the memory cells of one of the rows.

In a refinement of the second embodiment, each of the groups of rows includes the same number of rows. In a further refinement, the array further includes an electronic circuit provided for an application of voltages to the gate junction and the source/drain junctions of memory cells in read, write, and erase operations, whereby the electronic circuit is configured to apply a write voltage to any one of the bit lines and an inhibit voltage to a neighboring bit line, the inhibit voltage being appropriate to inhibit a write operation at the memory cells belonging to NAND strings that are coupled to the neighboring bit line. Furthermore, the array may include select transistors as a switch in every bit line, and two global bit lines, whereby every second bit line in succession being coupled to the first one of the global bit lines by means of the select transistors, and the other bit lines being coupled to the second one of the global bit lines by means of the select transistors.

In a third embodiment, the array includes a first group of memory cells, each memory cell including a first source/drain region, a second source/drain region and a gate, the memory cells of the first group being coupled in series such that the first source/drain of one cell is coupled to the second source/drain region of an adjacent cell. The array further includes a second group of memory cells, each memory cell including a first source/drain region, a second source/drain region and a gate, the memory cells of the second group being coupled in series such that the first source/drain of one cell is coupled to the second source/drain region of an adjacent cell. A third group of memory cells is included in the array, each memory cell including a first source/drain region, a second source/drain region and a gate, the memory cells of the third group being coupled in series such that the first source/drain of one cell is coupled to the second source/drain region of an adjacent cell. The array further includes a fourth group of memory cells, each memory cell including a first source/drain region, a second source/drain region and a gate, the memory cells of the fourth group being coupled in series such that the first source/drain of one cell is coupled to the second source/drain region of an adjacent cell.

The third embodiment of the array further includes a first global bit line coupled to the first source/drain region of a memory cell in the first group, to the second source/drain region of a memory cell in the second group, to the first source/drain region of a memory cell in the third group, and to the second source/drain region of a memory cell in the fourth group. The array further includes a second global bit line coupled, through a first select transistor, to the second source/drain region of a second memory cell in the first group and to the first source/drain region of a second memory cell in the second group, the second global bit line being coupled, through a second select transistor, to the second source/drain region of a second memory cell in the third group and to the first source/drain region of a second memory cell in the fourth group. The array further includes a first group of word lines, each word line in the first group being coupled to the gate of one memory cell in the first group of memory cells and to the gate of one memory cell in a third group of memory cells. The array further includes a second group of word lines, each word line in the second group being coupled to the gate of one memory cell in the second group of memory cells and to the gate of one memory cell in a fourth group of memory cells.

In a refinement of the array in accordance with the third embodiment, each of the memory cells includes two separate storage sites, one of the storage sites being located near the first source/drain region and the other one of the storage sites being located near the second source/drain region. In another refinement, each of the memory cells includes a charge trapping layer.

In another refinement, the array in accordance with the third embodiment includes erase circuitry configured to cause at least one selected one of the memory cells to be erased by Fowler-Nordheim tunneling of electrons from the selected at least one of the memory cells. In another refinement, the erase circuitry causes each of the word lines in the first group of word lines to be set to a high voltage and causes the first global bit line and the second global bit line to be provided with a low voltage. In another refinement, the high voltage is about 15 V and wherein the low voltage is about 0 V. The third embodiment of the array may further include write circuitry configured to cause a selected one of the memory cells to be written to by hot hole injection. In such an embodiment, the selected one of the memory cells comprises a memory cell in the fourth group of memory cells, the first global bit line is set to a write voltage, the second global bit line is set to a low voltage, the first select transistor is disabled, the second select transistor is enabled, the word line in the second group of word lines that is coupled to the gate of the selected one of the memory cells is set to a negative voltage that is lower than the low voltage provided at the second global bit line, and each of the other word lines in the second group of word lines are set to a voltage higher than the low voltage provided at the second global bit line. In a further refinement, the write voltage is about 4 V, the low voltage is about 0 V, and the negative voltage is about −7 V.

In another embodiment of the invention, a memory cell arrangement is provided that includes a first bit line, a second bit line, a third bit line, a first NAND memory cell string comprising a plurality of serially source-to-drain coupled non-volatile memory cells, a second NAND memory cell string comprising a plurality of serially source-to-drain coupled non-volatile memory cells, the first bit line being coupled to a source/drain region of a first non-volatile memory cell of the plurality of serially source-to-drain coupled non-volatile memory cells of the first NAND string, the second bit line being coupled to a source/drain region of a first non-volatile memory cell of the plurality of serially source-to-drain coupled non-volatile memory cells of the second NAND string, and the third bit line being coupled to a source/drain region of a last non-volatile memory cell of the plurality of serially source-to-drain coupled non-volatile memory cells of the first NAND string and to a source/drain region of a last non-volatile memory cell of the plurality of serially source-to-drain coupled non-volatile memory cells of the second NAND string.

The non-volatile memory cells may be charge storage memory cells, e.g., charge trapping memory cells, e.g., multi-bit non-volatile memory cells, wherein the multi-bit non-volatile memory cells may have at least two separate charge storage sites.

Furthermore, a plurality of word lines may be provided, each word line coupled to a control region of at least one non-volatile memory cell controlling the conduction state of the at least one non-volatile memory cell.

Each word line may be coupled to a control region of a non-volatile memory cell of the plurality of serially source-to-drain coupled non-volatile memory cells of the first NAND string and to a control region of a non-volatile memory cell of the plurality of serially source-to-drain coupled non-volatile memory cells of the second NAND string.

In an embodiment of the invention, the memory cell arrangement further includes a third NAND memory cell string comprising a plurality of serially source-to-drain coupled non-volatile memory cells, a fourth NAND memory cell string comprising a plurality of serially source-to-drain coupled non-volatile memory cells, wherein the first bit line is coupled to a source/drain region of a first non-volatile memory cell of the plurality of serially source-to-drain coupled non-volatile memory cells of the third NAND string, and the second bit line is coupled to a source/drain region of a first non-volatile memory cell of the plurality of serially source-to-drain coupled non-volatile memory cells of the fourth NAND string. The third bit line is coupled to a source/drain region of a last non-volatile memory cell of the plurality of serially source-to-drain coupled non-volatile memory cells of the third NAND string and to a source/drain region of a last non-volatile memory cell of the plurality of serially source-to-drain coupled non-volatile memory cells of the fourth NAND string.

In an embodiment of the invention, the non-volatile memory cells have active areas including the source/drain regions and the active areas have a zigzag structure.

In another embodiment of the invention, the first bit line, the second bit line and the third bit line have a zigzag structure.

Furthermore, an electronic circuit may be provided that provides voltages to the word lines and the bit lines in read, write and erase operations.

The electronic circuit may be configured such that it applies a write voltage to the third bit line and an inhibit voltage to the first bit line, thereby inhibiting a write operation at the non-volatile memory cells of the plurality of serially source-to-drain coupled non-volatile memory cells of the first NAND string, or that it applies a write voltage to the third bit line and an inhibit voltage to the first bit line, thereby inhibiting a write operation at the non-volatile memory cells of the plurality of serially source-to-drain coupled non-volatile memory cells of the second NAND string.

The electronic circuit may further be configured such that it applies write voltages to the bit lines and the word lines so as to write a non-volatile memory cell using hot hole injection.

The electronic circuit may be configured such that it applies erase voltages to the bit lines and the word lines so as to erase the non-volatile memory cell using Fowler Nordheim tunneling.

The electronic circuit may be configured such that it applies read voltages to the bit lines and the word lines so as to read the content of a non-volatile memory cell of the plurality of serially source-to-drain coupled non-volatile memory cells of the first NAND string by detecting a current flow through the plurality of serially source-to-drain coupled non-volatile memory cells of the first NAND string; or that it applies read voltages to the bit lines and the word lines so as to read the content of a non-volatile memory cell of the plurality of serially source-to-drain coupled non-volatile memory cells of the second NAND string by detecting a current flow through the plurality of serially source-to-drain coupled non-volatile memory cells of the second NAND string.

Each bit line may be provided with a select transistor individually selecting the respective bit line.

In one exemplary embodiment of the invention, a first global bit line is provided that is coupled to the first bit line and the second bit line via the select transistors of the first bit line and the second bit line, respectively. Furthermore, a second global bit line is provided that is coupled to the third bit line via a select transistor of the third bit line.

In another embodiment of the invention, a method of writing a memory cell of a memory cell arrangement is provided. In accordance with the method, voltages are applied at bit lines and word lines of the memory cell arrangement, which includes a first bit line, a second bit line, a third bit line, a first NAND memory cell string comprising a plurality of serially source-to-drain coupled non-volatile memory cells, a second NAND memory cell string comprising a plurality of serially source-to-drain coupled non-volatile memory cells, the first bit line being coupled to a source/drain region of a first non-volatile memory cell of the plurality of serially source-to-drain coupled non-volatile memory cells of the first NAND string, the second bit line being coupled to a source/drain region of a first non-volatile memory cell of the plurality of serially source-to-drain coupled non-volatile memory cells of the second NAND string, the third bit line being coupled to a source/drain region of a last non-volatile memory cell of the plurality of serially source-to-drain coupled non-volatile memory cells of the first NAND string and to a source/drain region of a last non-volatile memory cell of the plurality of serially source-to-drain coupled non-volatile memory cells of the second NAND string, and a plurality of word lines, each word line coupled to a control region of at least one non-volatile memory cell controlling the conduction state of the at least one non-volatile memory cell. A write voltage is applied to the third bit line and an inhibit voltage to the first bit line, thereby inhibiting a write operation at the non-volatile memory cells of the plurality of serially source-to-drain coupled non-volatile memory cells of the first NAND string, or a write voltage is applied to the third bit line and an inhibit voltage to the first bit line, thereby inhibiting a write operation at the non-volatile memory cells of the plurality of serially source-to-drain coupled non-volatile memory cells of the second NAND string.

The voltages to the bit lines and the word lines may be applied so as to write a non-volatile memory cell using hot hole injection.

In accordance with another embodiment of the invention, a method of erasing memory cells of a memory cell arrangement is provided, wherein voltages are applied at bit lines and word lines of the memory cell arrangement, which includes a first bit line, a second bit line, a third bit line, a first NAND memory cell string comprising a plurality of serially source-to-drain coupled non-volatile memory cells, a second NAND memory cell string comprising a plurality of serially source-to-drain coupled non-volatile memory cells, the first bit line being coupled to a source/drain region of a first non-volatile memory cell of the plurality of serially source-to-drain coupled non-volatile memory cells of the first NAND string, the second bit line being coupled to a source/drain region of a first non-volatile memory cell of the plurality of serially source-to-drain coupled non-volatile memory cells of the second NAND string, the third bit line being coupled to a source/drain region of a last non-volatile memory cell of the plurality of serially source-to-drain coupled non-volatile memory cells of the first NAND string and to a source/drain region of a last non-volatile memory cell of the plurality of serially source-to-drain coupled non-volatile memory cells of the second NAND string, and a plurality of word lines, each word line coupled to a control region of at least one non-volatile memory cell controlling the conduction state of the at least one non-volatile memory cell. Erase voltages are applied to the bit lines and the word lines so as to erase the non-volatile memory cells using Fowler Nordheim tunneling.

In accordance with another embodiment of the invention, a method of reading the content of a memory cell of a memory cell arrangement is provided, wherein voltages are applied at bit lines and word lines of the memory cell arrangement, which includes a first bit line, a second bit line, a third bit line, a first NAND memory cell string comprising a plurality of serially source-to-drain coupled non-volatile memory cells, a second NAND memory cell string comprising a plurality of serially source-to-drain coupled non-volatile memory cells, the first bit line being coupled to a source/drain region of a first non-volatile memory cell of the plurality of serially source-to-drain coupled non-volatile memory cells of the first NAND string, the second bit line being coupled to a source/drain region of a first non-volatile memory cell of the plurality of serially source-to-drain coupled non-volatile memory cells of the second NAND string, the third bit line being coupled to a source/drain region of a last non-volatile memory cell of the plurality of serially source-to-drain coupled non-volatile memory cells of the first NAND string and to a source/drain region of a last non-volatile memory cell of the plurality of serially source-to-drain coupled non-volatile memory cells of the second NAND string, and a plurality of word lines, each word line coupled to a control region of at least one non-volatile memory cell controlling the conduction state of the at least one non-volatile memory cell. Read voltages are applied to the bit lines and the word lines so as to read the content of a non-volatile memory cell of the plurality of serially source-to-drain coupled non-volatile memory cells of the first NAND string by detecting a current flow through the plurality of serially source-to-drain coupled non-volatile memory cells of the first NAND string. In another embodiment of the invention, read voltages are applied to the bit lines and the word lines so as to read the content of a non-volatile memory cell of the plurality of serially source-to-drain coupled non-volatile memory cells of the second NAND string by detecting a current flow through the plurality of serially source-to-drain coupled non-volatile memory cells of the second NAND string.

In an embodiment of the invention, the memory cells are recessed channel memory cells, as will be described in more detail below.

Figure 14A:
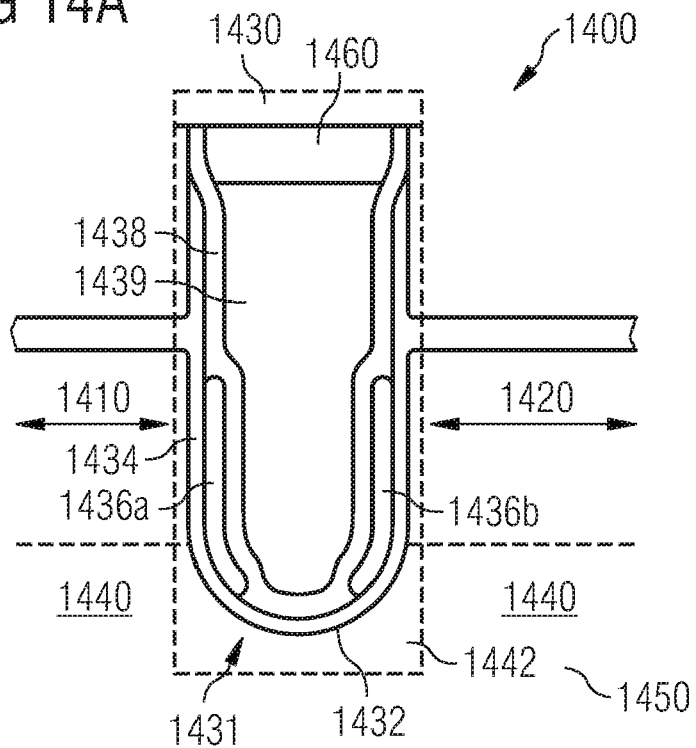
FIG. 14A shows a first embodiment of a recessed channel memory cell for use with the memory device.

FIG. 14A illustrates a first embodiment of a recessed channel memory cell 1400 for use with the memory device in accordance with the present invention. The view illustrates a cross-sectional view of the cell 1400 composed of first and second source/drain junctions (also referred to as source/drain regions) 1410 and 1420, and a region 1430 partially formed within an implanted well 1440 of a bulk semiconductor substrate. In a particular embodiment, the memory cell comprises an n-channel device, in which case the first and second source/drain junctions 1410 and 1420 are implanted n-type junctions, extending, for example, 30 to 40 nm below the surface of the bulk substrate. Of course, the memory cell 1400 may consist of a p-channel device, in which case the first and second source/drain junctions 1410 and 1420 will be implanted p-type junctions. In a particular embodiment of the invention, the first and second source/drain junctions 1410 and 1420 are implanted after the formation of the gate junction. An example of this process is described below.

The region 1430 of the memory cell includes an active region 1431 resident in the implanted well region 1440 between the first and second source/drain junctions 1410 and 1420. The active region 1431 includes a recessed channel, which may be rendered electrically conductive in response to an appropriate voltage application to a gate contact layer 1439 (which will be described in more detail below) and to the first and second source/drain junctions 1410 and 1420. Furthermore, the region 1430 includes a first dielectric layer 1434, a charge trapping layer 1436a and 1436b, a second dielectric layer 1438, and a gate contact layer 1439. The active region 1431 optionally includes an enhancement implant, such as a halo implant to enhance the channel doping concentration. For example, the end portions of the active region 1431 that are adjacent to the first and second source/drain junctions 1410 and 1420 of an n-channel device may include a halo implant comprising a p-type doping which is slightly higher than that of the p-well of the well region 1440. Similarly, an n-type halo implant may be employed at the end portion of the active region 1431 that are adjacent to the first and second source/drain junctions 1410 and 1420 of a p-channel device, the implanted halo having a slightly higher doping concentration than the n-well of the well region 1440 in the active region 1431. Additionally, the first well of the memory device (e.g., a p-well) may be formed within a second well (e.g., an n-well), thereby forming a triple well structure known in the art if a p-substrate is used.

In the exemplary embodiment illustrated, the active region 1431 extends below (seen in a vertical direction) the first and second source/drain junctions 1410 and 1420 and is formed in a rounded geometry. The rounded active region geometry provides an actual gate length which is longer than the straight line length (horizontal dimensions) between the first and second source/drain junctions 1410 and 1420, thereby providing a conventional gate length channel (which may be required due to relatively high operating voltages, or to achieve the target cell lifetime) within a smaller lateral footprint. The degree to which a footprint is reduced is determined by the radius of the active region 1431. In particular, when the active region 1431 is shaped to form a radius R which is one-half the separation between the first and second source/drain junctions 1410 and 1420, the active region 1431 forms a semi-circle between the first and second source/drain junctions 1410 and 1420, and the lateral footprint becomes $2/\pi$ shorter, or about 64% of the actual length of the active region 1431. Larger radii can be employed as well, with a correspondingly smaller difference between the lateral footprint and the effective length of the active region 1431.

The region 1430 further includes a charge trapping layer 1436a, 1436b coupled to the active region 1431 via a first dielectric layer 1434. The first dielectric layer 1434 is an oxide layer, e.g., a silicon oxide layer, thermally grown to a thickness (vertical dimension shown) of about 2 to about 6 nm, e.g., about 3 to 4 nm, in an exemplary embodiment. Other materials and dimensions may be employed in alternative embodiments.

The charge trapping layer 1436a, 1436b (or simply 1436) may be composed of a single storage section coupled (via the first dielectric layer 1434) to the active region 1431, or multiple storage sections 1436a and 1436b, each coupled to the active region 1431, as shown. In either instance, the charge trapping layer 1436a, 1436b may consist of a layer of silicon nitride deposited (e.g., through low pressure chemical vapor deposition or LPCVD process) at a thickness of between 3-8 nm, e.g., 4-6 nm. Multiple storage sections, when employed, are separated by a predefined distance along the trench shape, e.g., 15-30 nm. The first dielectric layer 1434 is rounded to generally follow the rounded contour of the active region 1431, thereby providing a coupling path between the charge trapping layer 1436a, 1436b and the active region 1431.

In a further particular embodiment, the charge trapping layer 1436a, 1436b is removed from (i.e., not in contact with) an adjacently located shallow trench isolation (STI). This arrangement provides increased isolation compared to another embodiment of the memory cell 1400 in which the charge trapping layer 1436a, 1436b is in contact with the STI. These features are further described below.

The region 1430 further includes a gate contact layer 1439 coupled to the charge trapping layer 1436a, 1436b via a second dielectric layer 1438. The second dielectric layer 1438 may be a high temperature oxide (HTO), which is 4-15 nm, e.g., 6-10 nm in thickness and may be formed using a combination of thermal growth and a chemical vapor deposition (CVD) processes to precisely control the layer's thickness. Other materials and dimensions may be used in alternative embodiments. In the illustrated embodiment shown, the second dielectric layer 1438 is formed to follow the contour of the charge storage layer 1436.

The gate contact layer 1439 is deposited over the second dielectric layer 1438 at least in the areas proximate to the charge trapping layer 1436a, 1436b, the deposition in one embodiment, being in a manner generally conformal to the second dielectric layer 1438. The gate contact layer 1439 may be composed of a variety of materials, such as poly-Si, Ge, Ge—Si mixtures, TiN, TaN and similar materials available in the particular fabrication process employed.

A portion of a word line 1460 is deposited over the gate contact layer 1439 within the recessed channel 1442, completing the gate junction's construction. The word line 1460 may be composed of a variety of materials, e.g., Co, Ti, poly-Si, or other conductive materials available in the particular fabrication process used. Furthermore, a salicidation process may be used to further improve the conductivity of the word line in particular embodiments.

As can be seen, the word line 1460 is formed in a self-aligned manner with the memory cell's gate contact layer 1439 and the region 1430. Implantation of the source/drain junctions 1410 and 1420 can be performed in a self-aligned manner to the gate contact layer 1439 and the region 1430, when source/drain implantation occurs after the formation of the gate contact layer 1439. An example of this process is further illustrated below.

Figure 14B:
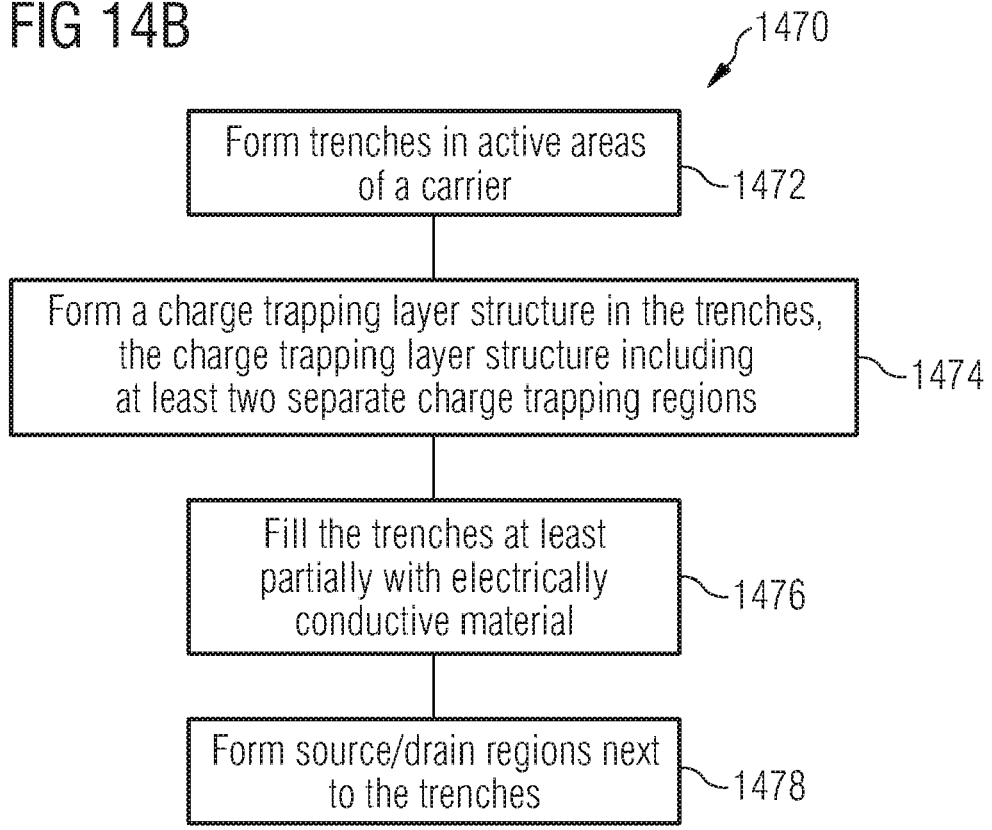
FIG. 14B shows an exemplary method for manufacturing the memory cell of FIG. 14A.

FIG. 14B illustrates an exemplary method of manufacturing the memory cell 1400 of FIG. 14A in accordance with the present invention in a flow diagram 1470.

At 1472, trenches are formed in active areas of a carrier. In the context of this description the active area may be understood to include the area in which the source/drain regions are formed as well as an active region, which is the region between the source/drain regions of a transistor in which an electrically conductive channel may be formed in response to appropriate voltages being applied to the gate contact layer 1439 and the source/drain regions of a transistor or a memory cell being formed by a transistor. In an embodiment of the invention, the carrier may be a substrate, e.g., a semiconductor substrate. In one embodiment of the invention, the semiconductor substrate is a bulk semiconductor substrate, in an alternative embodiment of the invention, the semiconductor substrate is a silicon-on-insulator semiconductor substrate (SOI). The semiconductor material may be silicon, in an alternative embodiment of the invention, semiconductor material may be a compound semiconductor material such as a IV-IV-semiconductor material (such as silicon germanium (SiGe)), a III-V-semiconductor material (such as gallium arsenide (GaAs)) or a II-VI-semiconductor material. Other appropriate semiconductor materials may also be used in alternative embodiments of the invention.

At 1474, a charge trapping layer structure is formed in the trenches, the charge trapping layer structure comprising at least two separate charge trapping regions. In one embodiment of the invention, the charge trapping layer structure includes a dielectric layer made of a material selected from the group consisting of silicon nitride ($Si_3N_4$), aluminum oxide ($Al_2O_3$), hafnium oxide ($HfO_2$), zirconium oxide ($ZrO_2$), yttrium oxide ($Y_2O_3$), lanthanum oxide ($LaO_2$), amorphous silicon, tantalum oxide ($Ta_2O_5$), titanium oxide ($TiO_2$), and an aluminate. An example for an aluminate is an alloy of the components aluminum, zirconium and oxygen (AlZrO). In an alternative embodiment of the invention, the charge trapping layer structure includes one, two, three, four or even more dielectric layers being formed above one another. Furthermore, in an alternative embodiment of the invention, the charge trapping layer structure includes a nitride-oxide layer structure, thereby forming an ONO structure together with the gate isolation layer, which may be made of an oxide.

At 1476, the trenches are at least partially filled with electrically conductive material such as poly-silicon. The electrically conductive material in one embodiment of the invention forms the gate contact layer 1439.

At 1478, source/drain regions are formed next to the trenches.

In an embodiment of the invention, the region 1430 of the memory cell is formed, wherein the region 1430 includes an active region 1431, a charge trapping layer 1436 coupled to the active region 1431 via a first dielectric layer 1434, and a gate contact layer 1439 coupled to the charge trapping layer 1436 via a second dielectric layer 1438. In a particular embodiment, the formation of the active region 1431 is achieved by forming an implanted well (an n- or p-well) 1440 into a bulk semiconductor substrate 1450, and subsequently forming a recessed channel 1432 within the implanted well, the recessed channel 1432 extending a predefined depth into the implanted well. The charge trapping layer 1436 may be formed in a single section operable to store a single bit, or be formed into multiple sections for storing multiple bits. In an embodiment of the invention, the multiple sections may be separated from each other by means of another dielectric material such as an oxide, thereby forming separated charge trapping regions, one bit of information being stored in each charge trapping region. Furthermore, the charge trapping layer 1436 may be formed so as to be in contact with an adjacent shallow trench isolation barrier.

FIGS. 15A to 15G illustrate exemplary processes by which the first dielectric layer 1434, the charge trapping layer 1436, the second dielectric layer 1438, and the gate contact layer 1439 are formed, e.g., in a way as illustrated in more detail below.

In an embodiment of the invention, first and second drain/source junctions 1410 and 1420 are formed on opposing sides of, and coupled to the active region 1431. In a specific embodiment of the invention, the source/drain junctions 1410 and 1420 are implanted at a depth shallower than the bottom of the recessed channel 1432, and in a particular embodiment, the source/drain junctions 1410 and 1420 are implanted to a depth of "one radius" shallower than the recessed channel depth, the "one radius" referring to the radius of the active region 1431.

FIGS. 15A to 15G illustrate exemplary processes by which the first and second source/drain junctions 1410 and 1420 are formed.

Furthermore, in an embodiment of the invention, a word line 1460 is formed coupled to the gate contact layer 1439. In a specific embodiment of the invention, the word line is deposited in such a manner as to be self-aligned with the gate contact layer 1439. An example of this process is illustrated in FIGS. 15A to 15G below.

FIG. 15A illustrates a top view of a memory array portion 1500 in which the memory cell 1400 is employed in accordance with an embodiment of the invention. The memory array portion 1500 may comprise a portion of the memory arrays described herein, for example the memory arrays described and illustrated in FIGS. 8 to 11.

Memory array portion 1500 includes views AA and STI, indicating cross-sectional views of the active area (AA) and shallow trench isolation (STI), and views WL and S/D indicating cross-sectional views of the word line area (WL) and source/drain area (S/D).

FIGS. 15B to 15G illustrate the array portion 1500 in various states of manufacture in accordance with an embodiment of the present invention. Each of FIGS. 15B to 15G illustrate four views, corresponding to the AA, STI, WL, and S/D views, the orientations of which are shown in FIG. 15A.

Initially, a carrier (e.g., a bulk substrate) 1450 with an implanted well 1440 is provided. The well implant 1440 may be of n or p-type doping, as required by the particular type of gate region desired. Subsequently, a pad oxide layer 1512 is grown (or deposited) on the substrate in the implanted region 1440 along which the word lines are to be formed. Next, a first hardmask 1513 (e.g., poly) and next a second hardmask 1514 (e.g., nitride) are sequentially deposited over the array. A conventional STI module is next initiated to provide shallow trench isolations (STI) 1520 between active areas. A third hardmask 1515 (e.g., nitride) is deposited over the second hardmask 1514. Word line patterns are formed in the first hardmask 1513, the second hardmask 1514 and the third hardmask 1515 on the array, the word line patterns oriented in a perpendicular pattern crossing the STI 1520 and defining the eventual position of the conductive word lines 1460 later formed in the process. Next, recessed channels 1432 are etched into the well implanted region 1440. The STI trenches are subsequently filled. FIG. 15B illustrates the resulting structure in each of the AA, STI, WL, and S/D views. Although the mask layers described above are described as hardmask, any suitable auxiliary mask may be provided in alternative embodiments of the invention. In an embodiment of the invention, the auxiliary masks may be made of e.g., silicon oxide, silicon nitride or carbon. In an embodiment of the invention, the respective layers may also be provided without being used in a lithographic process as a mask layer but may be used for different purposes.

Referring now to FIG. 15C, the process continues whereby the first dielectric layer 1434 is deposited/grown along the direction of the word lines. Next, the charge trapping layer 1436*a* and 1436*b* is next deposited/grown over the array portion. Subsequently, a masking layer 1532 is formed over the areas in recessed channels 1432 where the charge trapping layer 1436*a* and 1436*b* is to be retained. The masking layer 1532 may be a variety of materials, for example, carbon, silicon dioxide, silicon nitride, as well as similar materials available for the particular fabrication process. The masking layer 1532 is patterned as a sidewall spacer using a lithographic process including a spacer etch process.

The ONO layers which may be formed on the back wall of the STI structure as a result of the foregoing processes are removed. In this embodiment, a hardmask is patterned inside the recessed channel that covers the charge trapping layer 1436*a* and 1436*b* only on portions of the sidewalls of the substrate material but not on the exposed side wall which contacts the STI 1520. Subsequently, the interior of the recessed channel is etched until layer 1436 of the backwall of the recessed channel is removed. FIG. 15C illustrates the resulting structure in each of the AA, STI, WL and S/D views.

Next, the unprotected portions of the charge trapping layer 1436*a* and 1436*b*, in other words those portions that are not covered by the masking layer 1532, is removed, and the second dielectric layer 1438 is deposited over the array portion. FIG. 15D illustrates the resulting structure for each of the AA, STI, WL, and S/D views.

The process continues, whereby gate contact material 1439 is deposited along the direction of the word lines. Chemical mechanical polishing is subsequently performed to planarize the gate contact material 1439 where deposited with stop on the upper surface of the third hardmask 1515. FIG. 15E illustrates the resulting structure in each of the AA, STI, WL, and S/D views.

Next, the first, second and third hardmasks 1513, 1514 and 1515 are removed from the array. The source/drain junctions are next implanted (e.g., n+ doping profile) and annealed.

FIG. 15F illustrates the resulting structure in each of the AA, STI, WL, and S/D views.

The process continues, whereby word lines 1460 are deposited in contact with the gate contact layers 1439 consistent with the word line pattern previously defined. In case, a metallic gate material with a low enough resistivity such as tungsten (W) has been employed, an additional wordline conductor material may be omitted in an alternative embodiment of the invention. In a specific embodiment, the word lines are deposited in a manner self-aligned to the region 1430. A salicidation process may accompany the word line deposition process to further increase the word line's conductivity. Optionally, the source/drain regions 1410 and 1420 may include a salicidation process to increase these regions conductivity to bit line contacts where employed. FIG. 15G illustrates the resulting structure in each of the AA, STI, WL, and S/D views.

Additional processes known in the art, such as depositing isolation fills between the word line and bit line levels, forming the bit lines and the bit line contacts to the source/drain junctions are omitted in this description for reasons of clarity of the description.

Figure 16A:
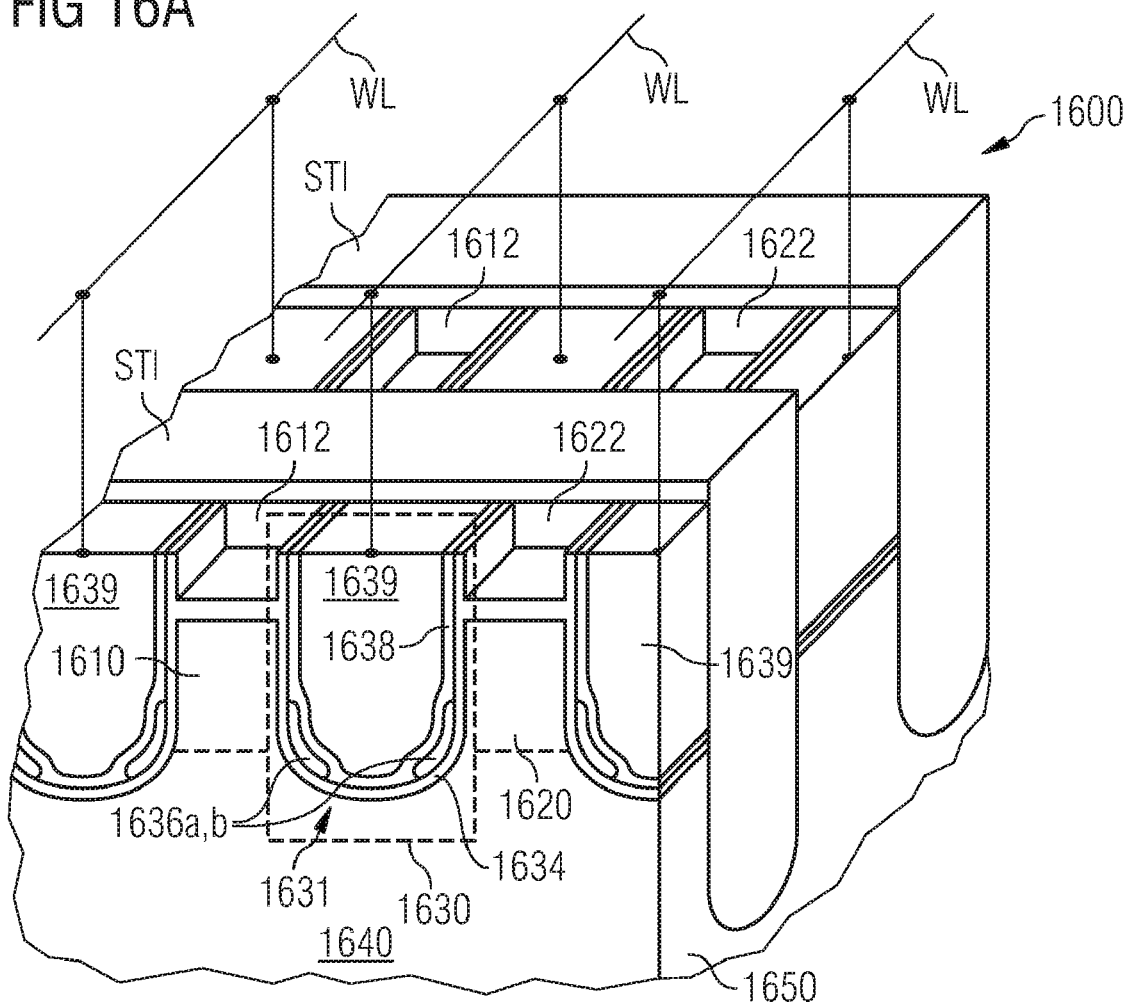
FIG. 16A shows a second embodiment of a recessed channel memory cell for use with the memory device.

FIG. 16A illustrates a second embodiment of a recessed channel memory cell 1600 for use with the memory device in accordance with the present invention. The view illustrates a cross-sectional view of the cell 1600 composed of first and second source/drain regions 1610 and 1620, and a region 1630 formed within an implanted well 1640 (n- or p-type, or an n-well within a p-well or p-well within an n-well to form a triple well structure) of a bulk semiconductor substrate. In a particular embodiment of the invention, the first and second source/drain regions 1610 and 1620 are implanted and annealed after the formation of the gate junction. An example of this process is described below.

The construction of the memory cell is largely similar to that of the first embodiment, wherein the region 1630 of the memory cell includes a charge trapping layer 1636*a* and 1636*b* (shown as two sections 1636*a* and 1636*b*, although a single section may be employed alternatively; in either case, the layer may be referred to simply as layer 1636) coupled to an active region 1631 via a first dielectric layer 1634, and a gate contact layer 1639 coupled to the charge trapping layer 1636 via a second dielectric layer 1638. The first and second dielectric layers 1634 and 1638, the charge trapping layer 1636, and the gate contact layer 1639 may be constructed as described above in the first recessed memory cell embodiment.

A feature of the gate junction which is distinguished from the first embodiment 1400 is that the charge trapping layer 1636 is removed from the STI barrier. This feature is further described below.

Further distinguishing, recesses 1612 and 1622 are formed above the first and second source/drain regions, respectively. The recesses 1612 and 1622 enable bit line contact to the source/drain regions 1610 and 1620 in a self-aligned manner. These processes are further illustrated and described below. Optionally, halo implants are used in the first and second source/drain regions 1610, 1620 to reduce drain/source current leakage, the implantation of which is self-aligned with the pre-formed active region. In a particular embodiment, the halo implants consist of $B^+$, $BF_2^+$ or $In^+$ implants for n-channel devices, and $P^+$ or $As^+$ implants for p-channel devices. The halo implant is formed by an implantation process using energy high enough to enhance the active region doping concentration (i.e., the region, in which the channel may be formed) after thermal processing below (in vertical dimensions) and close to the heavily doped source/drain junctions.

Figure 16B:
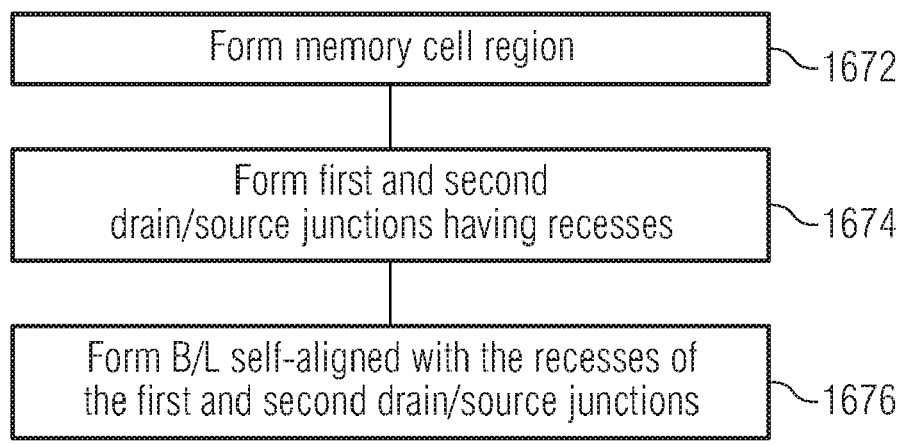
FIG. 16B illustrates an exemplary method for manufacturing the memory cell of FIG. 16A.

FIG. 16B illustrates an exemplary method for manufacturing the memory cell 1600 of FIG. 16A in accordance with the present invention. At 1672, a memory cell region string is formed, the memory cell region string including an active region 1631, a charge trapping layer 1636 coupled to the active region 1631 via a first dielectric layer 1634, and a gate contact layer 1639 coupled to the charge trapping layer 1636 via a second dielectric layer 1638. In a particular embodiment, the formation of the active region 1631 is achieved by forming an implanted well (an n- or p-well) 1640 into a bulk semiconductor substrate 1650, and subsequently forming a recessed channel within the implanted well, the recessed channel extending a predefined depth into the implanted well. The memory cell region string extends in a first direction, and is formed into individual memory cells 1630 through STI formed in an intersecting manner in a second direction.

The charge trapping layer 1636a and 1636b may be formed in a single continuous region operable to provide a single threshold voltage level to store a single bit, or be formed into multiple regions being separated from each other for providing multiple threshold voltage levels to store a plurality of bits by storing one bit in each of the multiple regions. Furthermore, the charge trapping layer 1636a and 1636b may be formed so as to be removed from an adjacent shallow trench isolation. FIGS. 17B to 17E illustrate exemplary processes by which the first dielectric layer 1634, the charge trapping layer 1636a and 1636b, the second dielectric layer 1638, and the gate contact layer 1639 are formed.

At 1674, first and second drain/source junctions 1610 and 1620 are formed on opposing sides of, and coupled to the active region 1631 for each memory cell 1630. In a specific embodiment of the invention, each of the first and second drain/source regions includes a recess enabling a self-aligned contact to a bit line. Additionally, the source/drain regions 1610 and 1620 are implanted at a depth shallower than the bottom of the recessed channel, and in a particular embodiment, the source/drain regions 1610 and 1620 are implanted to a depth of "one radius" shallower than the recessed channel depth, the "one radius" referring to the radius of the active region 1631. Further specifically, the first and second drain/source junctions 1610 and 1620 include a halo implant operable to attenuate drain/source current leakage. FIGS. 17B-17E illustrate exemplary processes by which the first and second source/drain junctions 1610 and 1620 are formed.

In an embodiment of the invention, the process further includes, at 1676, forming a bit line coupled to the first and second drain/source regions 1610 and 1620, the bit line being formed in a self-aligned manner to the recesses 1612 and 1622 of the first and second drain/source regions 1610 and 1620 in a particular embodiment. An example of this process is illustrated in FIGS. 17A to 17E below.

FIGS. 17A to 17E illustrate the array portion 1600 in various states of manufacture in accordance with the present invention. Initially, word line grooves are formed using first hardmask layers (e.g., nitride) in conjunction with standard patterning and etch techniques. The region 1630 is formed within an implanted well region 1640 through gate junction/word line string. Next, using an additional hardmask (e.g., a carbon layer on nitride), the active area AA mask is formed and a mask opening for the STI lines is employed, the STI lines intersecting (e.g., perpendicular) to the gate junction/word line string. STI trenches are reactively ion etched using an etch chemistry that removes the materials of the substrate in the regions, in which the STI is to be formed, and the memory cell region strings at generally the same rate. The etching process leaves a sufficient amount of the nitride mask to act as a CMP stop layer. The STI trenches are then oxidized, i.e., thin thermal oxide is grown before the STI trenches are filled with STI material such as high density plasma oxide.

Figure 17A:
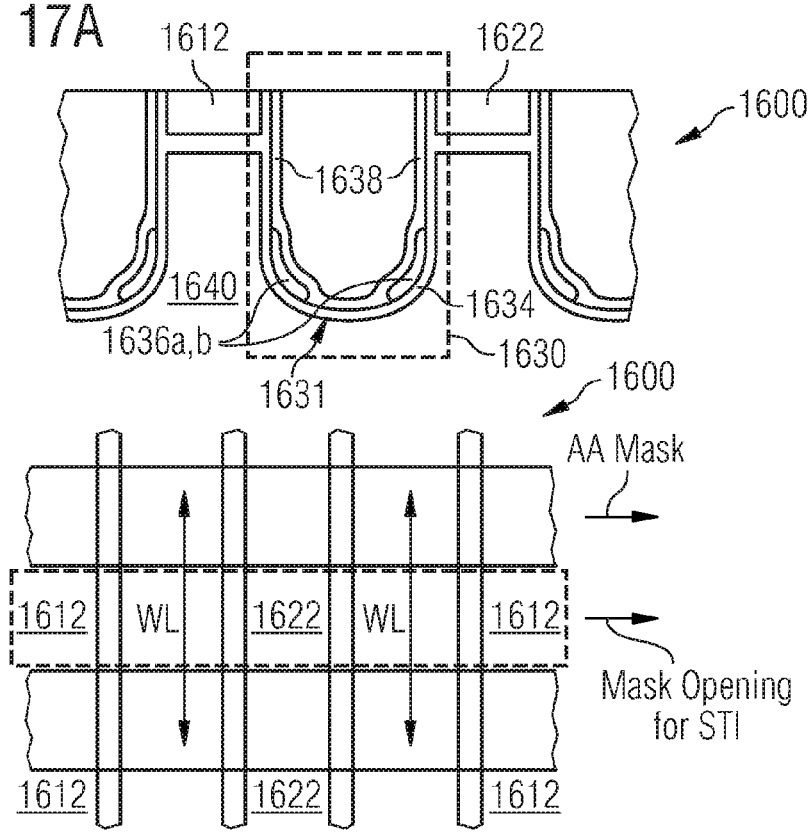
FIGS. 17A to 17E show views of an array portion employing the recessed channel memory cell shown in FIG. 16A in various states of manufacture in accordance with an embodiment of the invention.

The wafer is then planarized using a CMP process. The hardmasks are selectively removed using, e.g., phosphoric acid. Concurrently, source/drain recesses 1612 and 1622 are formed above the areas which are later implanted and annealed as source/drain junctions 1610 and 1620. In a particular embodiment, the gate region 1631, the first dielectric layer 1634, the charge trapping layer 1636, and the second dielectric layer 1638 are formed according to the aforementioned processes of memory cell 1400. The resulting structure is illustrated in FIG. 17A.

Figure 17B:
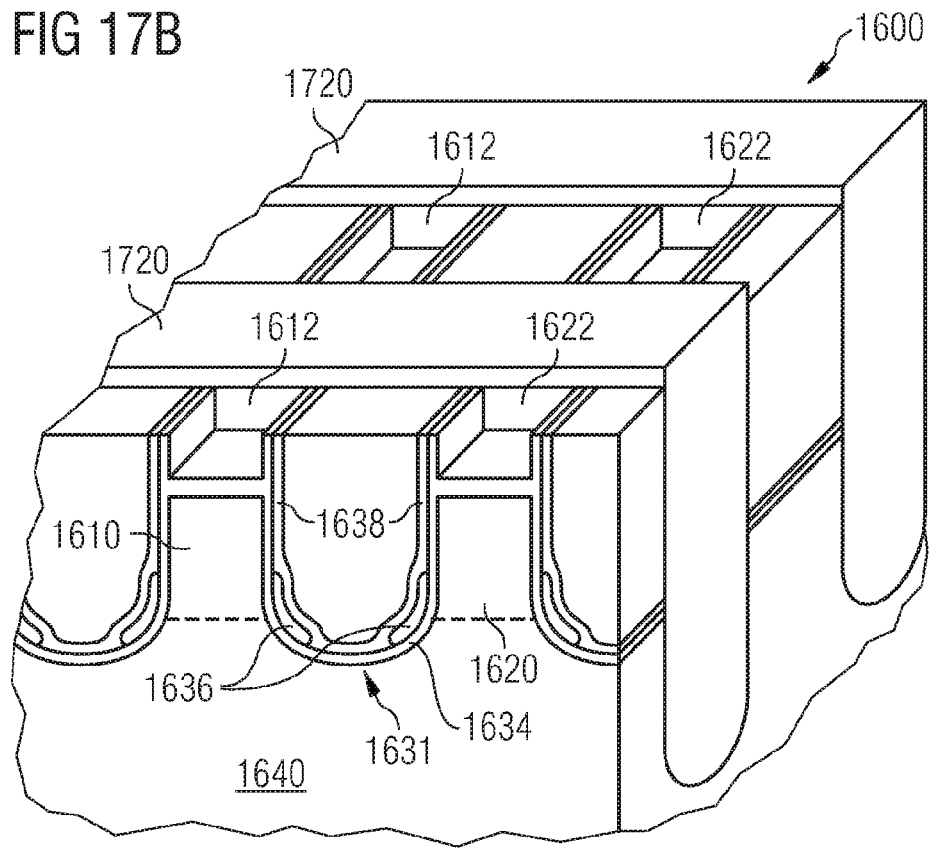
Figure 17C:
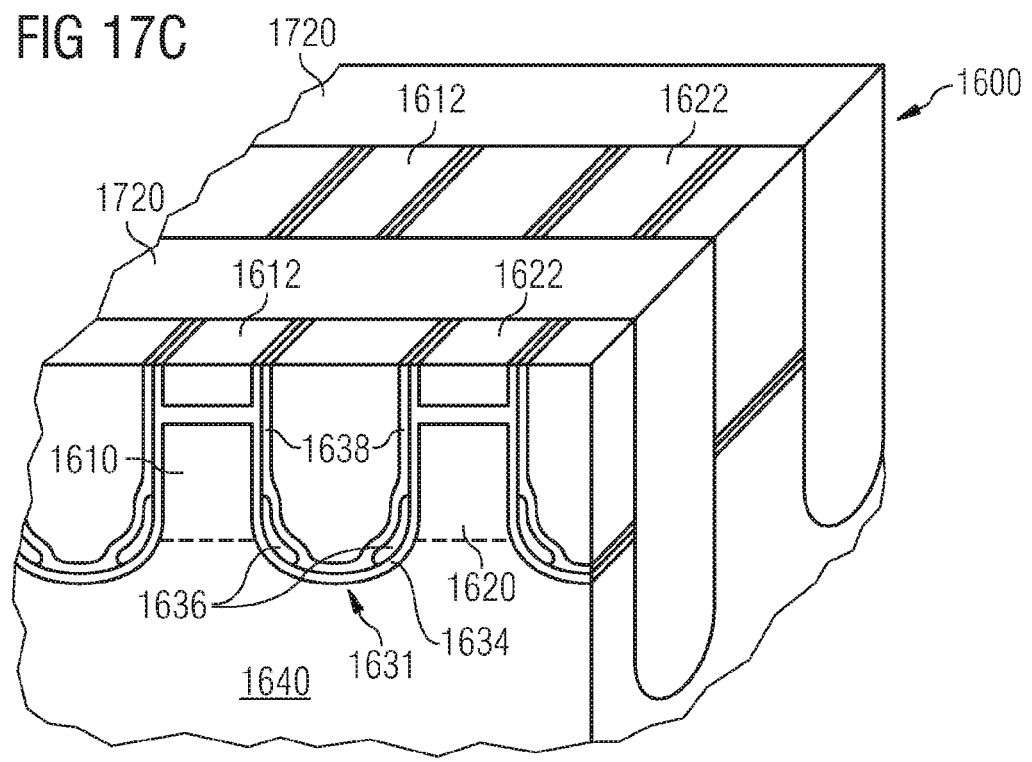

In an alternative embodiment to the processes mentioned in FIG. 17B, the hardmask stack used to define the STI structures consists of oxide rather than nitride. Then the first hardmask (nitride) serves as the CMP stop layer. The aforementioned processes of STI etch, fill, and planarization are repeated as described above. The resulting structure does not exhibit a step between the surface of the gate contact and the polished STI since the mask layer (oxide) is removed during planarization. The resulting structure is shown in FIG. 17C.

Figure 17D:
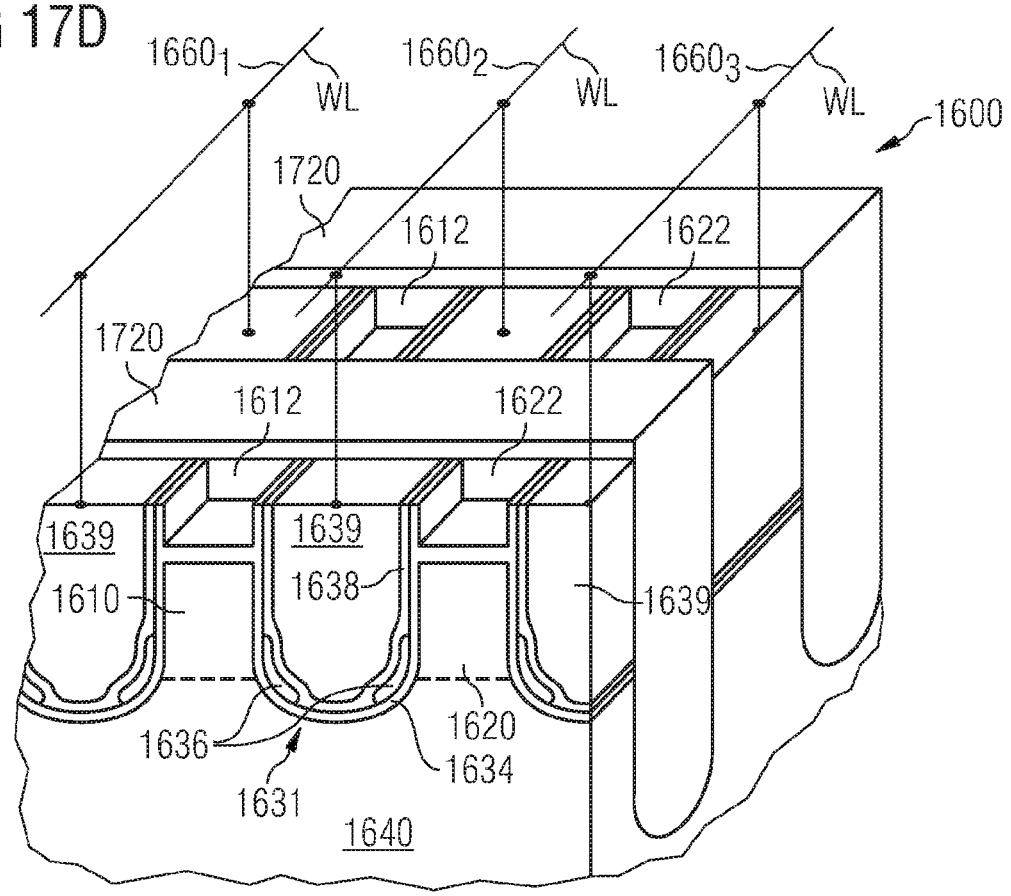
Figure 17E:
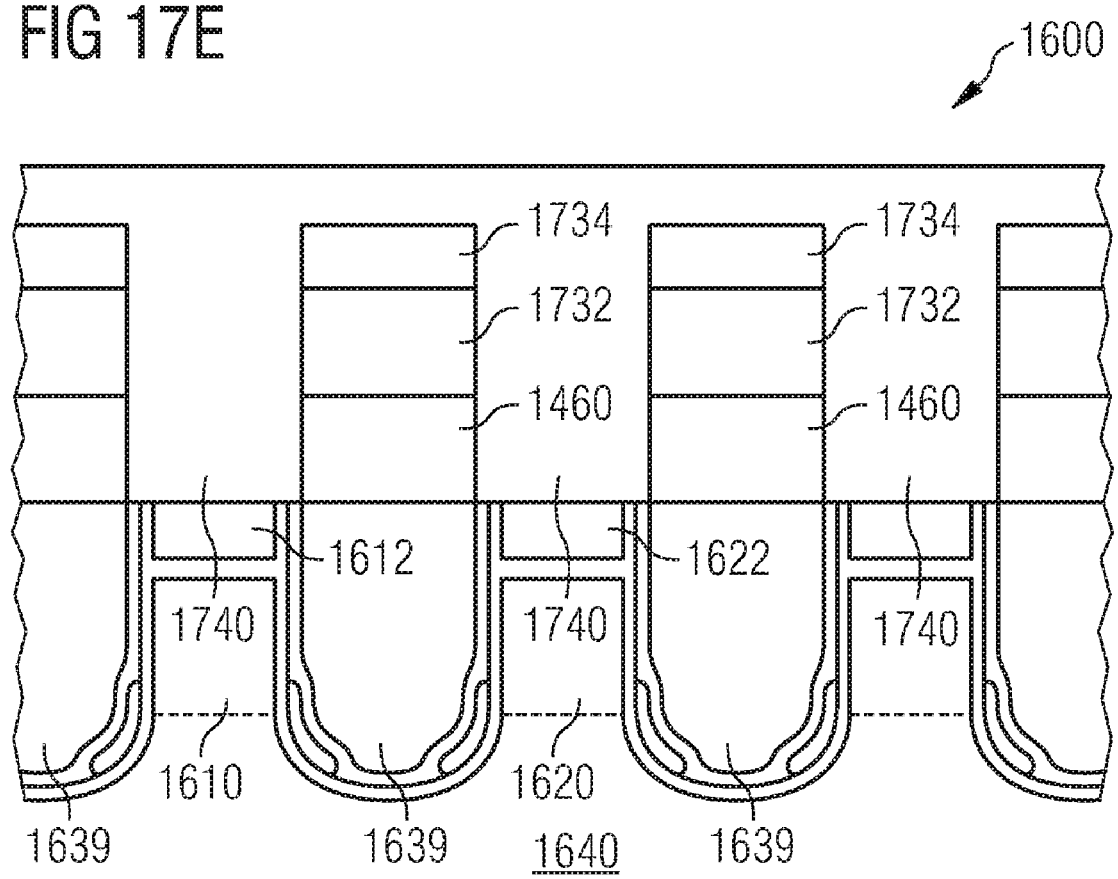

Subsequently, word lines 16601-16603 are formed in contact with the gate contact layers 1639, as shown in FIG. 17D. In an exemplary embodiment, the word lines include polysilicon 1460, a metal layer 1732, e.g., WSi, or a combination of WN/W (or Ti contact material), and the word line hardmask 1734. Isolation structures 1740 between the word lines are deposited and planarized along the word lines 1460. FIG. 17E shows a cross-section view of the array portion 1600 taken across a bit line 1740.

In one embodiment of the present invention, a charge-trapping memory cell arrangement is provided including an array of multi-bit memory cells that provides a higher storage density than previous virtual-ground arrays.

In a further embodiment of the invention, an operation mode of the memory device is disclosed to achieve an appropriate performance of the device.

This multi-bit memory device comprises an array of memory cells being arranged in rows and columns and forming a virtual-ground NAND architecture. The memory cells are charge-trapping memory cells comprising two separate storage sites, each one of the storage sites being located near one of the source/drain junctions and the other one of the storage sites being located near the opposite source/drain junction.

The rows of the memory cells are arranged into groups of, e.g., the same number of rows. Along the columns, the memory cells are coupled in series by their source/drain junctions. The source/drain junctions that are common to memory cells of two adjacent groups of rows, i.e., the source/drain junctions situated between the groups of rows, form a special selection of source/drain junctions that are coupled by one bit line out of a plurality of bit lines. The bit lines are arranged parallel at a distance from one another along the columns. Word lines are arranged parallel at a distance from one another transversely to the bit lines along the rows.

Along each column, the source/drain junctions of the selection located between the group of rows are coupled either alternatingly to one of the bit lines and to a neighboring one of this bit line or sequentially to subsequent bit lines. In this manner, a plurality of serially-coupled NAND strings of memory cells are formed, each NAND string formed along one column and intersecting the same group of rows between the selection of source/drain junctions.

Each of the word lines couples the gate junctions of the memory cells of one of the rows. This means that each of the gate junctions of the memory cells of one NAND string is coupled to another one of the word lines that belong to this NAND string. The NAND strings are in one embodiment of the invention of the same length, thus comprising the same number of memory cells.

In an embodiment, the bit lines are arranged along the columns, e.g., essentially straight, and every bit line is coupled to the source/drain junctions that are common to four memory cells that are arranged in a square and thus belong to two rows and two columns.

Another embodiment comprises bit lines that are arranged in zigzag fashion along the columns. Every bit line is alternatingly coupled to source/drain junctions of memory cells of one of two neighboring columns.

Another embodiment comprises columns of memory cells in active areas that are arranged in zigzag fashion, while the bit lines can be straight or at least mainly straight. In this embodiment as well, every bit line is alternatingly coupled to source/drain junctions of memory cells of one of two neighboring columns.

A further embodiment comprises, e.g., straight bit lines that are arranged parallel at a distance from one another at a small angle to the columns of memory cells. Thus, the columns pass one bit line after another. Along each column, the source/drain junctions of the selection are sequentially coupled to subsequent bit lines.

An electronic circuit provided for an application of voltages to the memory cells to perform read, write, and erase operations, is, e.g., provided with means to apply a write voltage to any of the bit lines and an inhibit voltage to a neighboring bit line, which is appropriate to inhibit a write operation at the memory cells belonging to NAND strings that are coupled to the neighboring bit line.

Embodiments are provided with select transistors functioning as a switch to enable a coupled connection of every bit line individually to one of two global bit lines. In these embodiments, every second bit line in succession is coupled to the first one of the global bit lines by means of the select transistors, and the other bit lines are coupled to the other one of the global bit lines.

In another embodiment, a virtual-ground NAND memory device of the invention includes an array of memory cells arranged in rows and columns. The rows of the array are arranged into groups of the rows and each of the memory cells includes a recessed channel memory cell having a first source/drain junction, a second source/drain junction, and a gate junction coupled between the first and second source/drain junctions. The memory cells of the columns are coupled in series by the source/drain junctions, and a selection of the source/drain junctions are formed by source/drain junctions that are common to memory cells of two adjacent ones of the groups of rows. A plurality of bit lines are arranged parallel at a distance from one another along the columns, and along each of the columns, the selection of source/drain junctions are coupled alternatingly to one of the bit lines and to a neighboring one of the bit lines, thereby forming a plurality of serially-coupled NAND strings of memory cells, each NAND string formed along one column and intersecting the same group of rows between the selection of source/drain junctions.

In an embodiment of the invention, a memory cell arrangement is provided including a first bit line, a second bit line, a third bit line, a first NAND memory cell string comprising a plurality of serially source-to-drain coupled non-volatile recessed channel memory cells, a second NAND memory cell string comprising a plurality of serially source-to-drain coupled non-volatile recessed channel memory cells, the first bit line being coupled to a source/drain region of a first non-volatile recessed channel memory cell of the plurality of serially source-to-drain coupled non-volatile recessed channel memory cells of the first NAND string, the second bit line being coupled to a source/drain region of a first non-volatile recessed channel memory cell of the plurality of serially source-to-drain coupled non-volatile recessed channel memory cells of the second NAND string, and the third bit line being coupled to a source/drain region of a last non-volatile recessed channel memory cell of the plurality of serially source-to-drain coupled non-volatile recessed channel memory cells of the first NAND string and to a source/drain region of a last non-volatile recessed channel memory cell of the plurality of serially source-to-drain coupled non-volatile recessed channel memory cells of the second NAND string.

The non-volatile recessed channel memory cells may be charge storage recessed channel memory cells, e.g., charge trapping recessed channel memory cells. Furthermore, the non-volatile recessed channel memory cells may be multi-bit non-volatile recessed channel memory cells, which may have at least two separate charge storage sites.

In another embodiment of the invention, the memory cell arrangement has a plurality of word lines, each word line coupled to a control region of at least one non-volatile recessed channel memory cell controlling the conduction state of the at least one non-volatile recessed channel memory cell. Each word line may be coupled to a control region of a non-volatile recessed channel memory cell of the plurality of serially source-to-drain coupled non-volatile recessed channel memory cells of the first NAND string and to a control region of a non-volatile recessed channel memory cell of the plurality of serially source-to-drain coupled non-volatile recessed channel memory cells of the second NAND string.

In an exemplary embodiment of the invention, the memory cell arrangement has a third NAND memory cell string including a plurality of serially source-to-drain coupled non-volatile recessed channel memory cells and a fourth NAND memory cell string including a plurality of serially source-to-drain coupled non-volatile recessed channel memory cells. The first bit line is coupled to a source/drain region of a first non-volatile recessed channel memory cell of the plurality of serially source-to-drain coupled non-volatile recessed channel memory cells of the third NAND string. The second bit line is coupled to a source/drain region of a first non-volatile recessed channel memory cell of the plurality of serially source-to-drain coupled non-volatile recessed channel memory cells of the fourth NAND string. The third bit line is coupled to a source/drain region of a last non-volatile recessed channel memory cell of the plurality of serially source-to-drain coupled non-volatile recessed channel memory cells of the third NAND string and to a source/drain region of a last non-volatile recessed channel memory cell of the plurality of serially source-to-drain coupled non-volatile recessed channel memory cells of the fourth NAND string.

The non-volatile recessed channel memory cells may have active areas including the source/drain regions and the active areas may have a zigzag structure.

Alternatively, the first bit line, the second bit line and the third bit line may have a zigzag structure.

In an embodiment of the invention, an electronic circuit is included in the memory cell arrangement, wherein the electronic circuit provides voltages to the word lines and the bit lines in read, write and erase operations.

The electronic circuit may be configured to apply a write voltage to the third bit line and an inhibit voltage to the first bit line, thereby inhibiting a write operation at the non-volatile recessed channel memory cells of the plurality of serially source-to-drain coupled non-volatile recessed channel memory cells of the first NAND string, or to apply a write voltage to the third bit line and an inhibit voltage to the first bit line, thereby inhibiting a write operation at the non-volatile recessed channel memory cells of the plurality of serially source-to-drain coupled non-volatile recessed channel memory cells of the second NAND string.

Furthermore, the electronic circuit may be configured to apply write voltages to the bit lines and the word lines so as to write a non-volatile recessed channel memory cell using hot hole injection.

In another embodiment of the invention, the electronic circuit is configured to apply erase voltages to the bit lines and the word lines so as to erase the non-volatile recessed channel memory cell using Fowler Nordheim tunneling.

In another embodiment of the invention, the electronic circuit is configured to apply read voltages to the bit lines and the word lines so as to read the content of a non-volatile recessed channel memory cell of the plurality of serially source-to-drain coupled non-volatile recessed channel memory cells of the first NAND string by detecting a current flow through the plurality of serially source-to-drain coupled non-volatile recessed channel memory cells of the first NAND string; or to apply read voltages to the bit lines and the word lines so as to read the content of a non-volatile recessed channel memory cell of the plurality of serially source-to-drain coupled non-volatile recessed channel memory cells of the second NAND string by detecting a current flow through the plurality of serially source-to-drain coupled non-volatile recessed channel memory cells of the second NAND string.

Each bit line may be provided with a select transistor individually selecting the respective bit line.

The memory cell arrangement may further include a first global bit line coupled to the first bit line and the second bit line via the select transistors of the first bit line and the second bit line, respectively, and a second global bit line coupled to the third bit line via the select transistor of the third bit line.

In another embodiment of the invention, a method of manufacturing a memory cell arrangement is provided. The method includes forming trenches in active areas of a carrier, forming a charge trapping layer structure in the trenches, the charge trapping layer structure comprising at least two separate charge trapping regions, at least partially filling the trenches with electrically conductive material, and forming source/drain regions next to the trenches.

At least two separate charge trapping regions may be formed at least partially at opposite sidewalls of the trenches.

Furthermore, a first auxiliary mask may be formed on or above the main processing surface of the carrier, a second auxiliary mask may be formed on or above the first auxiliary mask, and shallow trench isolation structures may be formed in the carrier.

Electrically conductive material may be formed as the first auxiliary mask on or above the main processing surface of the carrier.

Dielectric material may be formed as the second auxiliary mask on or above the first auxiliary mask.

Furthermore, a third auxiliary mask may be formed on or above the second auxiliary mask.

The forming the charge trapping layer structure in the trenches may include forming a first dielectric layer, e.g., an oxide layer, in the trenches.

In an embodiment of the invention, the forming the charge trapping layer structure in the trenches includes forming a charge trapping layer, e.g., a nitride layer, e.g., a low pressure chemical vapor deposition nitride layer, on or above the first dielectric layer.

Further, the forming of the charge trapping layer structure in the trenches may include forming a fourth auxiliary mask on or above the charge trapping layer.

In an embodiment of the invention, the fourth auxiliary mask is partially removed such that a portion of the charge trapping layer at the bottom of the trenches is exposed. Further, the exposed portion of the charge trapping layer may be at least be partially removed such that a portion of the first dielectric layer at the bottom of the trenches is exposed. In an embodiment of the invention, a second dielectric layer may be formed on or above the charge trapping layer and the exposed portion of the first dielectric layer.

Further, the source/drain regions may be formed next to the trenches by implanting doping atoms using the at least partially filled trenches as an implantation mask.

The trenches may be formed in active areas of a carrier by forming a trench structure extending in a length direction of the trench structure such that a plurality of memory cells can be formed from each trench structure. The trench structure may be at least partially filled with electrically conductive material.

Further, after the at least partial filling of the trench structure with electrically conductive material, shallow trench isolation structures may be formed in the carrier through the trench structure such that a plurality of trenches are formed in the trench structure, the trenches being isolated from each other by the shallow trench isolation structures.

In an embodiment of the invention, the forming the shallow trench isolation structures in the carrier includes forming the shallow trench isolation structures in the width direction of the trench structure.

In another embodiment of the invention, a memory cell is provided that includes a trench in a carrier, a charge trapping layer structure in the trench, the charge trapping layer structure comprising at least two separate charge trapping regions, electrically conductive material at least partially filled in the trench, and source/drain regions next to the trench.

The charge trapping layer structure may include a first dielectric layer at least partially disposed above the sidewalls and the bottom of the trench and a charge trapping layer at least partially disposed above the first dielectric layer.

The charge trapping layer structure may further include a second dielectric layer at least partially disposed above the charge trapping layer.

In another embodiment of the invention, a computer program product, resident on a computer readable medium, for providing instruction code of manufacturing a memory cell arrangement is provided. The computer program product includes instruction code to form trenches in active areas of a carrier, instruction code to form a charge trapping layer structure in the trenches, the charge trapping layer structure comprising at least two separate charge trapping regions, instruction code to at least partially fill the trenches with electrically conductive material, and instruction code to form source/drain regions next to the trenches.

Figure 18A:
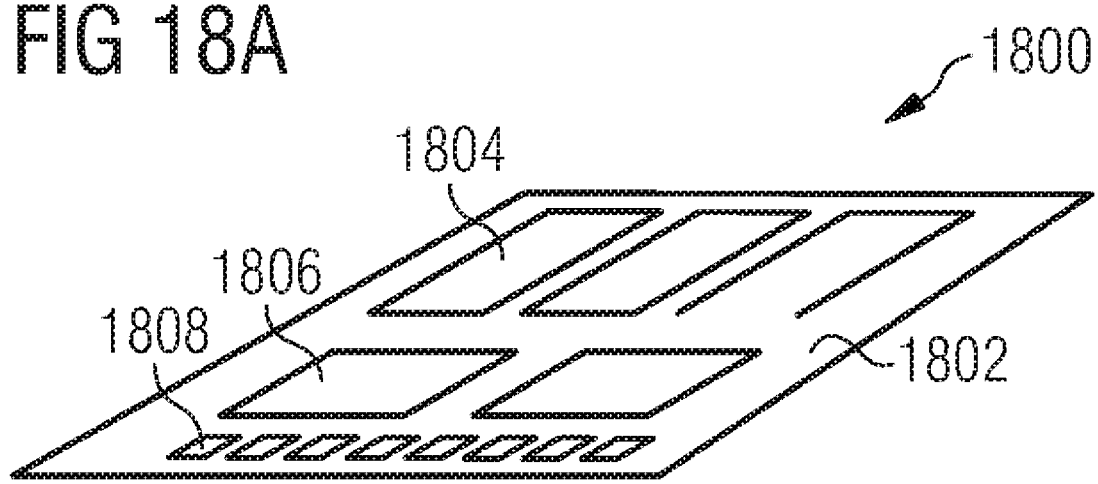
FIGS. 18A and 18B show a memory module (FIG. 18A) and a stackable memory module (FIG. 18B) in accordance with an embodiment of the invention.
Figure 18B:
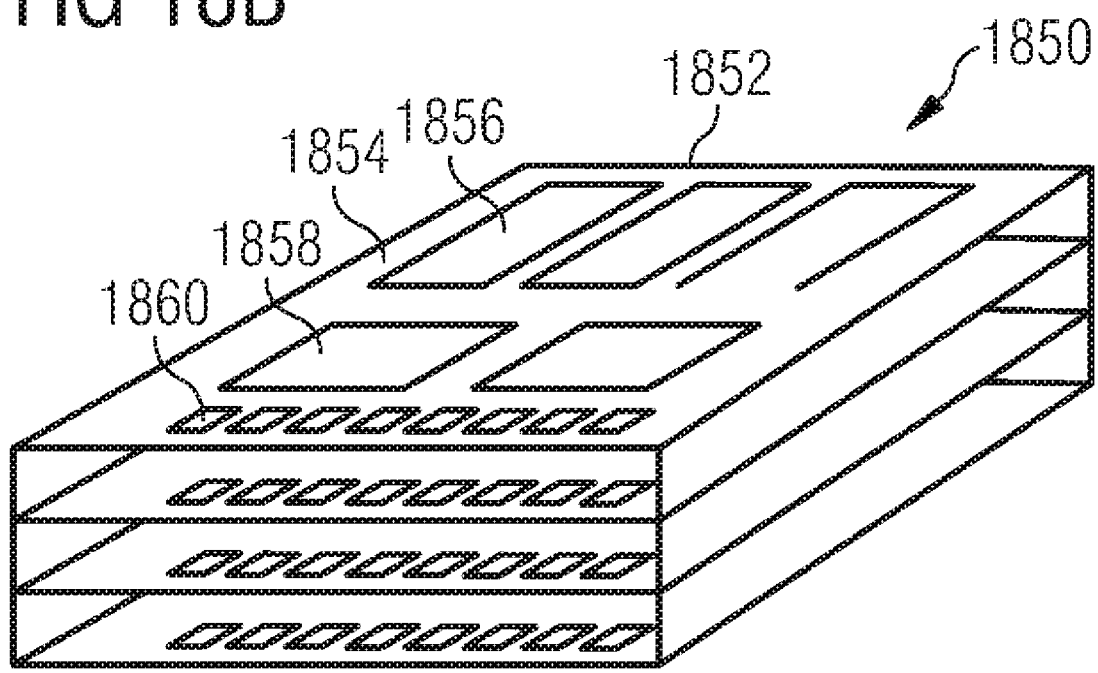

As shown in FIGS. 18A and 18B, in some embodiments, memory devices such as those described herein may be used in modules.

In FIG. 18A, a memory module 1800 is shown, on which one or more memory devices 1804 are arranged on a substrate 1802. The memory device 1804 may include numerous memory cells, each of which uses a memory element in accordance with an embodiment of the invention. The memory module 1800 may also include one or more electronic devices 1806, which may include memory, processing circuitry, control circuitry, addressing circuitry, bus interconnection circuitry, or other circuitry or electronic devices that may be combined on a module with a memory device, such as the memory device 1804. Additionally, the memory module 1800 includes multiple electrical connections 1808, which may be used to connect the memory module 1800 to other electronic components, including other modules.

As shown in FIG. 18B, in some embodiments, these modules may be stackable, to form a stack 1850. For example, a stackable memory module 1852 may contain one or more memory devices 1856, arranged on a stackable substrate 1854. The memory device 1856 contains memory cells that employ memory elements in accordance with an embodiment of the invention. The stackable memory module 1852 may also include one or more electronic devices 1858, which may include memory, processing circuitry, control circuitry, addressing circuitry, bus interconnection circuitry, or other circuitry or electronic devices that may be combined on a module with a memory device, such as the memory device 1856. Electrical connections 1860 are used to connect the stackable memory module 1852 with other modules in the stack 1850, or with other electronic devices. Other modules in the stack 1850 may include additional stackable memory modules, similar to the stackable memory module 1852 described above, or other types of stackable modules, such as stackable processing modules, control modules, communication modules, or other modules containing electronic components.

In an embodiment of the invention, an integrated circuit having a memory cell arrangement is provided. The memory cell arrangement may include a first bit line, a second bit line, a third bit line, a first memory cell string having a plurality of serially source-to-drain coupled memory cells (e.g., recessed channel memory cells), a second memory cell string having a plurality of serially source-to-drain coupled memory cells (e.g., recessed channel memory cells). The first bit line may be coupled to a source/drain region of a first memory cell of the plurality of serially source-to-drain coupled memory cells of the first string. The second bit line may be coupled to a source/drain region of a first memory cell of the plurality of serially source-to-drain coupled memory cells of the second string. Furthermore, the third bit line may be coupled to a source/drain region of a last memory cell of the plurality of serially source-to-drain coupled memory cells of the first string and to a source/drain region of a last memory cell of the plurality of serially source-to-drain coupled memory cells of the second string.

The memory cell strings may be NAND memory cell strings.

Although the following embodiments refer to recessed channel memory cells, they are also provided for non-recessed channel memory cells.

In an embodiment of the invention, the recessed channel memory cells are non-volatile recessed channel memory cells, wherein the non-volatile recessed channel memory cells may be charge storage recessed channel memory cells. By way of example, the charge storage recessed channel memory cells may be charge trapping recessed channel memory cells.

In an embodiment of the invention, the recessed channel memory cells are multi-bit non-volatile recessed channel memory cells.

In an embodiment of the invention, the multi-bit recessed channel memory cells have at least two separate charge storage sites.

In another embodiment of the invention, the recessed channel memory cells are multi-level non-volatile recessed channel memory cells.

Furthermore, the integrated circuit may further include a plurality of word lines, each word line coupled to a control region of at least one recessed channel memory cell controlling the conduction state of the at least one recessed channel memory cell.

Each word line may be coupled to a control region of a recessed channel memory cell of the plurality of serially source-to-drain coupled recessed channel memory cells of the first string and to a control region of a recessed channel memory cell of the plurality of serially source-to-drain coupled recessed channel memory cells of the second string.

Furthermore, a third memory cell string may be provided including a plurality of serially source-to-drain coupled recessed channel memory cells, and a fourth memory cell string may be provided including a plurality of serially source-to-drain coupled recessed channel memory cells. The first bit line may be coupled to a source/drain region of a first recessed channel memory cell of the plurality of serially source-to-drain coupled recessed channel memory cells of the third string. The second bit line may be coupled to a source/drain region of a first recessed channel memory cell of the plurality of serially source-to-drain coupled recessed channel memory cells of the fourth string, and the third bit line may be coupled to a source/drain region of a last recessed channel memory cell of the plurality of serially source-to-drain coupled recessed channel memory cells of the third string and to a source/drain region of a last recessed channel memory cell of the plurality of serially source-to-drain coupled recessed channel memory cells of the fourth string.

The recessed channel memory cells may have active areas including the source/drain regions, and the active areas may have a zigzag structure.

In an embodiment of the invention, the first bit line, the second bit line and the third bit line have a zigzag structure.

The integrated circuit may further include an electronic circuit providing voltages to the word lines and the bit lines in read, write and erase operations.

The electronic circuit may be configured to apply a write voltage to the third bit line and an inhibit voltage to the first bit line, thereby inhibiting a write operation at the recessed channel memory cells of the plurality of serially source-to-drain coupled recessed channel memory cells of the first string, or to apply a write voltage to the third bit line and an inhibit voltage to the first bit line, thereby inhibiting a write operation at the recessed channel memory cells of the plurality of serially source-to-drain coupled recessed channel memory cells of the second string.

The electronic circuit may be configured to apply write voltages to the bit lines and the word lines so as to write a recessed channel memory cell using hot hole injection.

In an embodiment of the invention, the electronic circuit may be configured to apply erase voltages to the bit lines and the word lines so as to erase the recessed channel memory cell using Fowler Nordheim tunneling.

Furthermore, the electronic circuit may be configured to apply read voltages to the bit lines and the word lines so as to read the content of a recessed channel memory cell of the plurality of serially source-to-drain coupled recessed channel memory cells of the first string by detecting a current flow through the plurality of serially source-to-drain coupled recessed channel memory cells of the first string, or to apply read voltages to the bit lines and the word lines so as to read the content of a recessed channel memory cell of the plurality of serially source-to-drain coupled recessed channel memory cells of the second string by detecting a current flow through the plurality of serially source-to-drain coupled recessed channel memory cells of the second string.

Each bit line may be provided with a select transistor individually selecting the respective bit line.

The integrated circuit may further include a first global bit line coupled to the first bit line and the second bit line via the select transistors of the first bit line and the second bit line, respectively, and a second global bit line coupled to the third bit line via the select transistor of the third bit line.

In another embodiment of the invention, a method of manufacturing an integrated circuit having a memory cell arrangement is provided. The method may include forming trenches in active areas of a carrier, forming a charge trapping layer structure in the trenches, the charge trapping layer structure comprising at least two separate charge trapping regions, at least partially filling the trenches with electrically conductive material, and forming source/drain regions next to the trenches.

In an embodiment of the invention, the forming of the charge trapping layer structure in the trenches may include forming the at least two separate charge trapping regions at least partially at opposite sidewalls of the trenches.

Furthermore, the method may include forming a first auxiliary mask on or above the main processing surface of the carrier, forming a second auxiliary mask on or above the first auxiliary mask, forming shallow trench isolation structures in the carrier.

In an embodiment of the invention, the forming the first auxiliary mask on or above the main processing surface of the carrier may include forming electrically conductive material as the first auxiliary mask on or above the main processing surface of the carrier.

In an embodiment of the invention, the forming the second auxiliary mask on or above the main processing surface of the carrier may include forming dielectric material as the second auxiliary mask on or above the first auxiliary mask.

In an embodiment of the invention, the method may further include forming a third auxiliary mask on or above the second auxiliary mask.

The forming of the charge trapping layer structure in the trenches may include forming a first dielectric layer in the trenches.

The forming of the first dielectric layer in the trenches may include forming an oxide layer in the trenches.

The forming of the charge trapping layer structure in the trenches may include forming a charge trapping layer on or above the first dielectric layer.

The forming of the charge trapping layer may include forming a nitride layer.

In an embodiment of the invention, the forming of the nitride layer includes forming a low pressure chemical vapor deposition nitride layer.

Furthermore, the forming of the charge trapping layer structure in the trenches may include forming a fourth auxiliary mask on or above the charge trapping layer.

In an embodiment of the invention, the forming of the charge trapping layer structure in the trenches may include partially removing the fourth auxiliary mask such that a portion of the charge trapping layer at the bottom of the trenches is exposed.

Furthermore, the forming of the charge trapping layer structure in the trenches may include at least partially removing the exposed portion of the charge trapping layer such that a portion of the first dielectric layer at the bottom of the trenches is exposed.

Furthermore, the forming of the charge trapping layer structure in the trenches may include forming a second dielectric layer on or above the charge trapping layer and the exposed portion of the first dielectric layer.

In an embodiment of the invention, the forming of the source/drain regions next to the trenches includes implanting doping atoms using the at least partially filled trenches as an implantation mask.

In an embodiment of the invention, the forming of the trenches in active areas of a carrier includes forming a trench structure extending in a length direction of the trench structure such that a plurality of memory cells can be formed from each trench structure.

The at least partially filling the trenches with electrically conductive material may include at least partially filling the trench structure with electrically conductive material.

The method may further include after the at least partially filling the trench structure with electrically conductive material, forming shallow trench isolation structures in the carrier through the trench structure such that a plurality of trenches are formed in the trench structure, the trenches being isolated from each other by the shallow trench isolation structures.

The forming of the shallow trench isolation structures in the carrier may include forming the shallow trench isolation structures in the width direction of the trench structure.

In another embodiment of the invention, an integrated circuit having a memory cell is provided. The memory cell may include a trench in a carrier, a charge trapping layer structure in the trench, the charge trapping layer structure comprising at least two separate charge trapping regions, electrically conductive material at least partially filled in the trench, and source/drain regions next to the trench.

The charge trapping layer structure may include a first dielectric layer at least partially disposed above the sidewalls and the bottom of the trench, and a charge trapping layer at least partially disposed above the first dielectric layer.

The charge trapping layer structure may further include a second dielectric layer at least partially disposed above the charge trapping layer.

In another embodiment of the invention, a memory module is provided. The memory module may include a plurality of integrated circuits, wherein at least one integrated circuit of the plurality of integrated circuits has a memory cell arrangement. The memory cell arrangement may include a first bit line, a second bit line, a third bit line, a first memory cell string having a plurality of serially source-to-drain coupled memory cells, and a second memory cell string comprising a plurality of serially source-to-drain coupled memory cells. The first bit line may be coupled to a source/drain region of a first memory cell of the plurality of serially source-to-drain coupled memory cells of the first string. The second bit line may be coupled to a source/drain region of a first memory cell of the plurality of serially source-to-drain coupled memory cells of the second string. The third bit line may be coupled to a source/drain region of a last memory cell of the plurality of serially source-to-drain coupled memory cells of the first string and to a source/drain region of a last memory cell of the plurality of serially source-to-drain coupled memory cells of the second string.

In an embodiment of the invention, the memory module is a stackable memory module in which at least some of the integrated circuits are stacked one above the other.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising:
a first bit line;
a second bit line;
a third bit line;
a first memory cell string comprising a plurality of serially source-to-drain coupled memory cells;
a second memory cell string comprising a plurality of serially source-to-drain coupled memory cells;
the first bit line being coupled to a source/drain region of a first memory cell of the plurality of serially source-to-drain coupled memory cells of the first string;
the second bit line being coupled to a source/drain region of a first memory cell of the plurality of serially source-to-drain coupled memory cells of the second string; and
the third bit line being coupled to a source/drain region of a last memory cell of the plurality of serially source-to-drain coupled memory cells of the first string and to a source/drain region of a last memory cell of the plurality of serially source-to-drain coupled memory cells of the second string; and
wherein at least one memory cell of the first and/or second memory cell strings comprises:
a trench in a carrier, wherein the source/drain regions of the at least one memory cell is next to the trench;
a charge trapping layer structure in the trench, the charge trapping layer structure comprising at least two separate charge trapping regions and;
electrically conductive material at least partially filled in the trench.

2. The integrated circuit of claim 1, wherein the memory cell strings comprise NAND memory cell strings.

3. The integrated circuit of claim 1, further comprising: a plurality of word lines, each word line coupled to a control region of at least one memory cell controlling a conduction state of the at least one memory cell.

4. The integrated circuit of claim 3, wherein each word line is coupled to a control region of a memory cell of the plurality of serially source-to-drain coupled memory cells of the first string and to a control region of a memory cell of the plurality of serially source-to-drain coupled memory cells of the second string.

5. The integrated circuit of claim 1, further comprising:
a third memory cell string comprising a plurality of serially source-to-drain coupled memory cells;
a fourth memory cell string comprising a plurality of serially source-to-drain coupled memory cells;
the first bit line being coupled to a source/drain region of a first memory cell of the plurality of serially source-to-drain coupled memory cells of the third string;
the second bit line being coupled to a source/drain region of a first memory cell of the plurality of serially source-to-drain coupled memory cells of the fourth string; and
the third bit line being coupled to a source/drain region of a last memory cell of the plurality of serially source-to-drain coupled memory cells of the third string and to a source/drain region of a last memory cell of the plurality of serially source-to-drain coupled memory cells of the fourth string.

6. The integrated circuit of claim 1, wherein the memory cells have active areas including the source/drain regions; and wherein the active areas have a zigzag structure.

7. The integrated circuit of claim 1, wherein the charge trapping layer structure comprises:
a first dielectric layer at least partially disposed above the sidewalls and the bottom of the trench;
a charge trapping layer at least partially disposed above the first dielectric layer.

8. The integrated circuit of claim 7, wherein the charge trapping layer structure further comprises a second dielectric layer at least partially disposed above the charge trapping layer.

9. The integrated circuit of claim 1, wherein the at least one memory cell of the first and/or second memory cell strings further comprises a rounded active region geometry that provides an actual gate length which is longer than the horizontal straight line between the first and second source/drain regions of the at least one memory cell.

10. The integrated circuit of claim 9, wherein the source/drain regions of the at least one memory cell are at a depth of one radius shallower than the bottom of the trench, the one radius equal to the radius of the rounded active region geometry.

11. The integrated circuit of claim 1, wherein the source/drain regions of the at least one memory cell are at a depth shallower than the bottom of the trench.

12. A memory module, comprising:
a plurality of integrated circuits, wherein at least one integrated circuit of the plurality of integrated circuits comprises a memory cell arrangement, the memory cell arrangement comprising:
a first bit line;
a second bit line;
a third bit line;
a first memory cell string comprising a plurality of serially source-to-drain coupled memory cells;
a second memory cell string comprising a plurality of serially source-to-drain coupled memory cells;
the first bit line being coupled to a source/drain region of a first memory cell of the plurality of serially source-to-drain coupled memory cells of the first string;
the second bit line being coupled to a source/drain region of a first memory cell of the plurality of serially source-to-drain coupled memory cells of the second string; and
the third bit line being coupled to a source/drain region of a last memory cell of the plurality of serially source-to-drain coupled memory cells of the first string and to a source/drain region of a last memory cell of the plurality of serially source-to-drain coupled memory cells of the second string; and
wherein at least one memory cell of the first and/or second memory cell strings comprises:
a trench in a carrier, wherein the source/drain regions of the at least one memory cell is next to the trench;
a charge trapping layer structure in the trench, the charge trapping layer structure comprising at least two separate charge trapping regions and;
electrically conductive material at least partially filled in the trench.

13. The memory module of claim 12, wherein the memory module is a stackable memory module in which at least some of the integrated circuits are stacked one above the other.

14. The memory module of claim 12, wherein the charge trapping layer structure comprises:
a first dielectric layer at least partially disposed above the sidewalls and the bottom of the trench;
a charge trapping layer at least partially disposed above the first dielectric layer.

15. The memory module of claim 14, wherein the charge trapping layer structure further comprises a second dielectric layer at least partially disposed above the charge trapping layer.

16. The memory module of claim 12, wherein the at least one memory cell of the first and/or second memory cell strings further comprises a rounded active region geometry that provides an actual gate length which is longer than the horizontal straight line between the first and second source/drain regions of the at least one memory cell.

17. The memory module of claim 16, wherein the source/drain regions of the at least one memory cell are at a depth of one radius shallower than the bottom of the trench, the one radius equal to the radius of the rounded active region geometry.

18. The memory module of claim 12, wherein the source/drain regions of the at least one memory cell are at a depth shallower than the bottom of the trench.

* * * * *